United States Patent
Cheng

(10) Patent No.: US 8,159,039 B2
(45) Date of Patent: Apr. 17, 2012

(54) SUPERJUNCTION DEVICE HAVING A DIELECTRIC TERMINATION AND METHODS FOR MANUFACTURING THE DEVICE

(75) Inventor: Xu Cheng, Chandler, AZ (US)

(73) Assignee: Icemos Technology Ltd., Belfast, Northern Ireland (GB)

( * ) Notice: Subject to any disclaimer, the term of this patent is extended or adjusted under 35 U.S.C. 154(b) by 328 days.

(21) Appl. No.: 12/352,276

(22) Filed: Jan. 12, 2009

(65) Prior Publication Data

US 2009/0179298 A1     Jul. 16, 2009

Related U.S. Application Data

(60) Provisional application No. 61/020,540, filed on Jan. 11, 2008.

(51) Int. Cl.
*H01L 29/06* (2006.01)
*H01L 21/30* (2006.01)
*H01L 21/762* (2006.01)

(52) U.S. Cl. . 257/506; 257/481; 257/483; 257/E21.023; 257/E21.231; 438/478; 438/433; 438/270

(58) Field of Classification Search ............ 257/506, 257/481, 483, 484, 492, 493, E21.023, E21.231; 438/478, 433, 270
See application file for complete search history.

(56) References Cited

U.S. PATENT DOCUMENTS

| | | |
|---|---|---|
| 3,497,777 A | 2/1970 | Teszner |
| 4,491,486 A | 1/1985 | Iwai |
| 4,994,406 A | 2/1991 | Vasquez et al. |
| 5,216,275 A | 6/1993 | Chen |
| 5,395,790 A | 3/1995 | Lur |
| 5,438,215 A | 8/1995 | Tihanyi |
| 5,926,713 A | 7/1999 | Hause et al. |
| 6,066,878 A | 5/2000 | Neilson |
| 6,081,009 A | 6/2000 | Neilson |
| 6,174,773 B1 | 1/2001 | Fujishima |
| 6,184,555 B1 | 2/2001 | Tihanyi et al. |
| 6,291,856 B1 | 9/2001 | Miyasaka et al. |
| 6,300,171 B1 | 10/2001 | Frisina |
| 6,307,246 B1 | 10/2001 | Nitta et al. |

(Continued)

OTHER PUBLICATIONS

Chenming Hu; "Optimum Doping Profile for Minimum Ohmic Resistance and High-Breakdown Voltage;" IEEE Transaction on Electron Devices, vol. ED-26, No. 3, pp. 243-244; Mar. 1979.

(Continued)

*Primary Examiner* — Cuong Q Nguyen
*Assistant Examiner* — Cathy N Lam
(74) *Attorney, Agent, or Firm* — Panitch Schwarze Belisario & Nadel LLP

(57) ABSTRACT

A superjunction semiconductor device is provided having at least one column of a first conductivity type and at least one column of a second conductivity type extending from a first main surface of a semiconductor substrate toward a second main surface of the semiconductor substrate opposed to the first main surface. The at least one column of the second conductivity type has a first sidewall surface proximate the at least one column of the first conductivity type and a second sidewall surface opposed to the first sidewall surface. A termination structure is proximate the second sidewall surface of the at least one column of the second conductivity type. The termination structure includes a layer of dielectric of an effective thickness and consumes about 0% of the surface area of the first main surface. Methods for manufacturing superjunction semiconductor devices and for preventing surface breakdown are also provided.

8 Claims, 40 Drawing Sheets

U.S. PATENT DOCUMENTS

| | | | |
|---|---|---|---|
| 6,362,505 | B1 | 3/2002 | Tihanyi |
| 6,410,958 | B1 | 6/2002 | Usui et al. |
| 6,495,421 | B2 | 12/2002 | Luo |
| 6,504,230 | B2 | 1/2003 | Deboy et al. |
| 6,512,267 | B2 | 1/2003 | Kinzer et al. |
| 6,566,201 | B1 | 5/2003 | Blanchard |
| 6,624,494 | B2 | 9/2003 | Blanchard et al. |
| 6,686,244 | B2 | 2/2004 | Blanchard |
| 6,710,403 | B2 | 3/2004 | Sapp |
| 6,710,418 | B1 | 3/2004 | Sapp |
| 6,812,525 | B2 | 11/2004 | Bul et al. |
| 6,979,862 | B2 | 12/2005 | Henson |
| 7,015,104 | B1 | 3/2006 | Blanchard |
| 7,023,069 | B2 | 4/2006 | Blanchard |
| 7,041,560 | B2 | 5/2006 | Hshieh |
| 7,052,982 | B2 | 5/2006 | Hshieh et al. |
| 7,109,110 | B2 | 9/2006 | Hshieh |
| 2002/0070418 | A1 | 6/2002 | Kinzer et al. |
| 2004/0228068 | A1* | 11/2004 | Banerjee et al. ........... 361/306.3 |
| 2005/0116313 | A1 | 6/2005 | Lee et al. |
| 2005/0176192 | A1 | 8/2005 | Hshieh |
| 2005/0242411 | A1 | 11/2005 | Tso |
| 2006/0231915 | A1 | 10/2006 | Hshieh et al. |
| 2008/0290442 | A1* | 11/2008 | Hshieh et al. ................. 257/487 |

OTHER PUBLICATIONS

Rossel, P.; "Power M.O.S. Devices; Microelectron;" Reliab., vol. 24, No. 2, pp. 339-366; 1984.

Temple, Victor A.K. et al.; "A 600-Volt MOSFET Designed for Low On-Resistance;" IEEE Transactions on Electron Devices, vol. ED-27, No. 2, pp. 343-349; Feb. 1980.

Fujihira, Tatsuhiko; "Theory of Semiconductor Superjunction Devices;" Jpn. J. Appl. Phys., vol. 36, pp. 6254-6262; 1997.

Yamauchi et al.; "Electrical Properties of Super Junction p-n—Diodes Fabricated by Trench Filling;" 15th International Symposium on Power Semiconductor Devices and ICs, pp. 207-210; 2003.

Saito et al.; "600V Semi-superjunction MOSFET;" Papers of Technical Meeting on Electron Devices; IEE Japan, vol. Ed. 03, No. 44-49, pp. 27-30; 2003.

Bai et al., "Junction Termination Technique for Super Junction Devices;" 12th International Symposium on Power Semiconductor Devices and ICs, pp. 257-261; 2000.

Daniel et al.; "Modeling of the CoolMOS Transistor—Part I: Device Physics;" IEEE Transactions on Electron Devices, vol. 49, No. 5, pp. 916-922; May 2002.

Daniel, et al.; "Modeling of the CoolMOS Transistor—Part II: DC Model and Parameter Extraction;" IEEE Transactions on Electron Devices, vol. 49, No. 5, pp. 923-929; May 2002.

Mawby, Pa; "MOS Devices;" IGDS Course, University of Wales Swansea; 2003.

Office Action issued Nov. 3, 2011 in CN Application No. 200910002920.6.

* cited by examiner

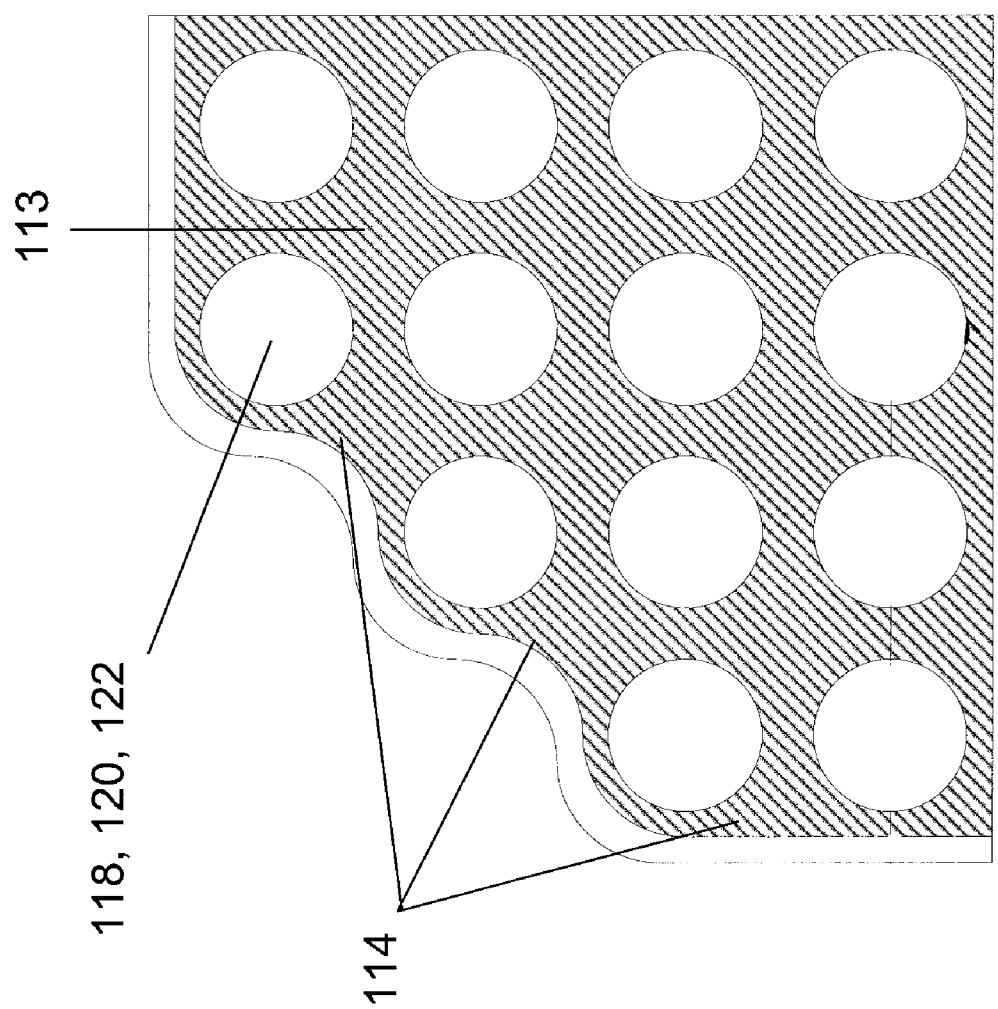

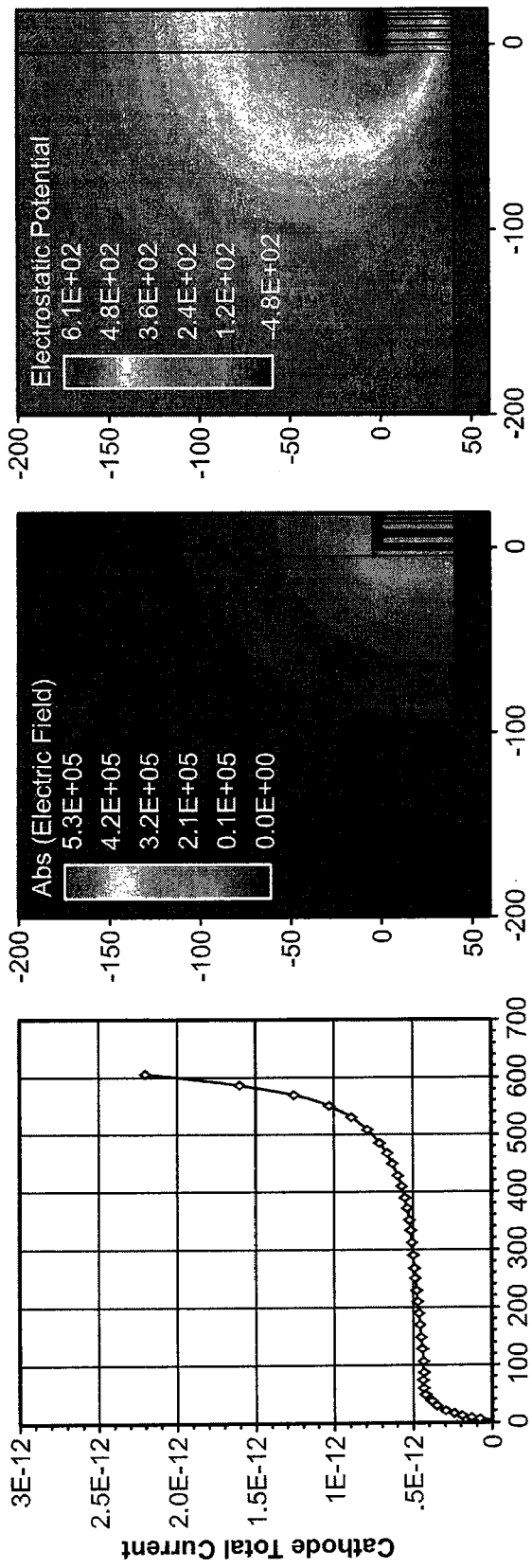

SUPERJUNCTION DEVICE HAVING A DIELECTRIC TERMINATION AND METHODS FOR MANUFACTURING THE DEVICE

CROSS-REFERENCE TO RELATED APPLICATIONS

This application claims the benefit of U.S. Provisional Patent Application No. 61/020,540, filed on Jan. 11, 2008, entitled "Superjunction Semiconductor Device Having A Dielectric Termination And Methods for Manufacturing The Device," the entire contents of which are incorporated by reference herein.

BACKGROUND OF THE INVENTION

Embodiments of the present invention relate to a superjunction semiconductor device and a method for manufacturing the superjunction semiconductor device. In particular, embodiments of the present invention relate to a superjunction device having a voltage termination structure having a layer of dielectric of an effective thickness.

The success of a controllable semiconductor device at high or ultra-high voltages is almost entirely determined by a successful implementation of the edge termination. Due to the termination of periodic cell structures at the edges of semiconductor devices, high electric fields appear along the edges. Some special arrangements, namely edge termination technologies, are necessary to prevent premature device breakdown along the edges. Field plates, multiple field limiting rings (FLR), semi-insulating polycrystalline silicon (SIPOS) as semi-resistive field plates, silicon etch contours, and beveled p-n junctions are representative edge termination technologies for high voltage semiconductor devices. As the voltage ratings of the semiconductor device increase, the termination region and the ratio between the termination region and the active region often increases. This results in a poorer yield and a higher on-state voltage. In addition, as the voltage ratings of the semiconductor device increase, more elaborate additional process steps for fabrication of the termination are required in order to prevent premature breakdown and to maintain the termination effectiveness.

The invention of superjunction devices by Dr. Xingbi Chen, as disclosed in U.S. Pat. No. 5,216,275, the contents of which are incorporated by reference herein, is a breakthrough and has opened a new scope for the high-voltage semiconductor devices. For example, a 600V superjunction metal-oxide-semiconductor field-effect-transistor (MOSFET) has only about $1/6^{th}$-$1/8^{th}$ of the on-state resistance of the conventional power MOSFET. To benefit from the superior performance of superjunction devices, the high-voltage edge termination is inevitable. Improvements to the performance of the superjunction devices may be seen in U.S. Pat. No. 6,410,958 ("Usui, et al.") and U.S. Pat. No. 6,307,246 ("Nitta, et al."), both of which are incorporated by reference herein, which show improved voltage breakdown characteristics in superjunction devices.

Prior art superjunction device edge termination designs consume a certain semiconductor area to realize the high breakdown voltage. For example, prior art termination regions typically include multiple field-limiting-rings (FLRs), which are a plurality of outwardly spaced apart doped regions surrounding a peripheral portion of the cell region. An alternate prior art termination region includes a field plate. In both examples, to increase the breakdown voltage in the cell, a greater area must be consumed by either the FLR structure or the field plate. The area consumed by the edge termination region does not contribute to the current-handling-capability of the device (which is determined by the active area size). It has been a goal in the industry to reduce the edge termination size to obtain higher semiconductor wafer output yield. It is desirable to provide an edge termination design that essentially does not consume any portion of the semiconductor wafer/die area.

Additionally, prior art superjunction device edge termination designs typically require a lightly doped epitaxy region (typically n-type, written as n⁻) in the edge termination region to achieve the high breakdown voltage. The lightly doped epitaxy region has a much lower doping concentration than conductivity regions in the active area (such as the n-columns). Therefore, manufacturers are forced to start with the lightly doped epi-layer or epi-process and convert the epi-layer into higher doped regions in the active area using different doping techniques.

It is desirable to provide an edge termination design without requiring the lightly doped region, thereby permitting the use of a moderately doped epi-layer or epi process and saving half of the doping process for active area formation. It is further desirable to provide a method for manufacturing superjunction devices with such an edge termination region, utilizing known techniques such as plasma etching, reactive ion etching (RIE), inductively coupled plasma (ICP) etching, sputter etching, vapor phase etching, chemical etching, deep RIE, or the like. It is further desirable to provide a method for preventing the premature break down of a superjunction device at the edge portion by using a dielectric termination.

BRIEF SUMMARY OF THE INVENTION

Briefly stated, a preferred embodiment of the present invention comprises a superjunction semiconductor device. At least one column of a first conductivity type extends from a first main surface of a semiconductor substrate toward a second main surface of the semiconductor substrate opposed to the first main surface. At least one column of a second conductivity type extends from the first main surface toward the second main surface. The at least one column of the second conductivity type has a first sidewall surface proximate the at least one column of the first conductivity type and a second sidewall surface opposed to the first sidewall surface. A termination structure is proximate the second sidewall surface of the at least one column of the second conductivity type. The termination structure includes a layer of dielectric of an effective thickness and consumes about 0% of the surface area of the first main surface.

Another preferred embodiment of the present invention comprises a method of manufacturing a superjunction semiconductor device. The method includes forming at least one column of a first conductivity type extending from a first main surface of a semiconductor substrate toward a second main surface of the semiconductor substrate opposed to the first main surface and forming at least one column of a second conductivity type extending from the first main surface toward the second main surface. The at least one column of the second conductivity type has a first sidewall surface proximate the at least one column of the first conductivity type and a second sidewall surface opposed to the first sidewall surface. The method also includes forming a termination structure proximate the second sidewall surface of the at least one column of the second conductivity type. The termination structure includes a layer of dielectric of an effective thickness and consumes about 0% of the surface area of the first main surface.

Still another preferred embodiment of the present invention comprises a method of preventing voltage breakdown at a surface of a semiconductor substrate of a superjunction semiconductor device. The method includes placing, proximate an edge portion of the semiconductor substrate, a termination structure having a layer of dielectric of an effective thickness. The termination structure consumes about 0% of the surface area of the surface of the semiconductor substrate.

BRIEF DESCRIPTION OF SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

In the drawings:

FIG. 2B is a top plan view of the superjunction semiconductor diode of FIG. 2A;

FIG. 4A shows results of simulated cathode total currents as a function of the cathode voltages for the simulation model of FIG. 3A;

FIG. 4B shows simulated electric field strength contours for the simulation model of FIG. 3A;

FIG. 4C shows simulated electric potential contours for the simulated model of FIG. 3A;

DETAILED DESCRIPTION OF THE INVENTION

Figure 1A:
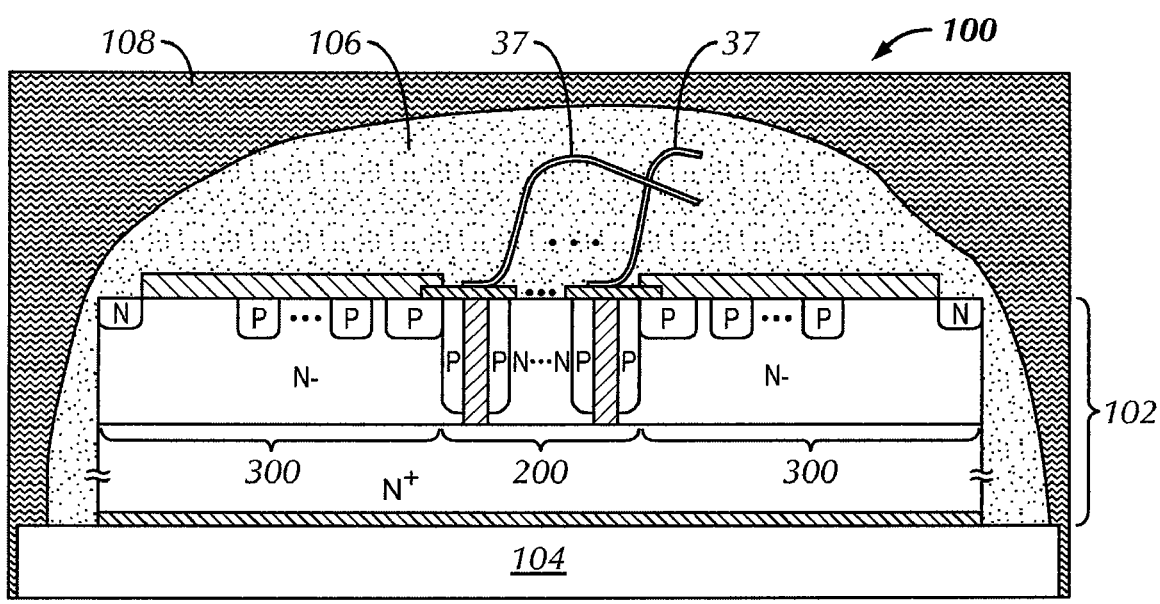
FIG. 1A is a cross-sectional elevational view of a superjunction semiconductor diode having a prior art multiple field limiting ring (FLR) termination structure.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, it must be noted that as used herein and in the appended claims, the singular forms "a," "an," and "the" include plural reference unless the context clearly dictates otherwise.

Although any embodiment of the present invention may refer to a particular conductivity (e.g., p-type or n-type), it will be readily understood by those skilled in the art that p-type conductivity can be switched with n-type conductivity and vice versa and the device will still be functionally correct (i.e., a first or second conductivity type). For example, metal oxide semiconductor field effect transistor (MOSFET)-gated devices and insulated gate bipolar transistors (IGBTs) can be fabricated in an epitaxial wafer with an n-type epitaxial layer over a p$^+$ substrate (or visa versa).

An n-type semiconductor includes any semiconductor obtained by n-type doping process, i.e., by adding an impurity (dopant) to a semiconductor, in order to increase the number of free electrons in the material. For example, an n-type semiconductor can be obtained by incorporating phosphorus (P), arsenic (As), or antimony (Sb), into silicon. The n-type semiconductor can be heavily doped (n$^+$), very heavily doped (n$^{++}$), lightly doped (n$^-$), or very lightly doped (n$^{--}$). Heavier doping of an n-type semiconductor results in a higher carrier concentration.

A p-type semiconductor includes any semiconductor obtained by p-type doping process, i.e., by adding an impurity (dopant) to a semiconductor, in order to increase the number of free holes in the material. For example, a p-type semiconductor can be obtained by incorporating boron (B) or aluminum (Al) into silicon. The p-type semiconductor can be heavily doped (p$^+$), very heavily doped (p$^{++}$), lightly doped (p$^-$), or very lightly doped (p$^{--}$). Heavier doping of a p-type semiconductor results in a higher carrier concentration.

Doping in accordance with various embodiments of the present invention can be carried out using any method or equipment known or to be developed for imparting impurities of either n-type or p-type into another material, including, for example, ion implantation and in-situ vapor deposition techniques.

As used herein, the term "termination structure" refers to a structure used to realize breakdown voltage close to ideal breakdown voltage at a surface of a semiconductor substrate. According to embodiments of the present invention, the termination structure includes a layer of dielectric of an effective thickness and consumes about 0% of the surface area of the surface. At a peripheral region of the semiconductor substrate, most, if not all, of the upper surface potential/voltage transition occurs across the dielectric material(s) outside of the semiconductor substrate, instead of across the edge of the semiconductor substrate, as occurs in traditional termination structures. Dielectrics suitable for termination structure formation according to embodiments of the present invention include, but are not limited to, air, a nitride, an oxide, a semi-insulating polycrystalline silicon (SIPOS), a silicon-rich nitride, silicon carbide, glass, epoxy, ceramic, silicone gel, molding compound, or a combination thereof.

The "effective thickness" as used herein, refers to that thickness of the layer of dielectric that achieves the blocking capacity in a semiconductor device that is being sought by a researcher, designer, or manufacturer of the semiconductor device. Methods are known in the art for modeling, designing, and testing the effective thickness of the layer of dielectric to be used for the instant semiconductor device. For example, the electric field contour and electrostatic potential contour for the instant semiconductor device can be simulated and used to determine the effective thickness.

As used herein, the term "terminal structure" or "edge termination" refers to a structure that contains any one or more of the structures involved in a terminal for a semiconductor device. The "terminal structure" can be, for example, an electrode that is connected to the semiconductor device, such as a gate electrode, a source electrode, or a drain electrode. The "terminal structure" can also be, for example, a doped region in the semiconductor substrate that is in close proximity or adjacent to an electrode connected to the semiconductor device. Examples of such doped regions, include, but are not limited to, a body region, a body contact region, and a source region. The "terminal structure" can be a combination of any one or more of the electrodes and the doped regions. In one embodiment of the present invention, the "terminal structure" comprises a gate electrode, a body region, a body contact region, a source region and a source electrode.

The device according to embodiments of the present invention can embody either a cellular design (wherein the body regions are a plurality of cellular regions) or a single body design (where the body region includes a single region formed in an elongated pattern, typically a serpentine pattern). Although the device will be described as a cellular design throughout the following description for ease of understanding, it is understood that embodiments of the present invention encompass both a cellular design and a single body design. By way of example, a device according to embodiments of the present invention is among many such devices integrated with logic and/or other components into a semiconductor chip as part of a power integrated circuit. Alternatively, a device according to embodiments of the present invention is among many such devices integrated together to form a discrete transistor device.

As used herein, the term "high voltage semiconductor device" refers to a semiconductor device that is able to sustain high reverse-bias voltage in the off-state, and carry a large amount of current and yield low voltage in the on-state. A high voltage semiconductor device can accommodate a higher current density, higher power dissipation and/or higher reverse breakdown voltage than a regular semiconductor device.

As used herein, the term "power semiconductor device" refers to a semiconductor device that is able to carry a larger amount of energy. A power semiconductor device typically is able to support a larger reverse-bias voltage in the off-state. A power semiconductor device can be a high voltage semiconductor device. However, a power semiconductor device can also be a low voltage device, such as an integrated power device. The term "power semiconductor device" includes, but is not limited to, a high voltage discrete device, a low voltage discrete device, a high voltage integrated circuit (IC), and a low voltage IC. Power devices can be used as switches or rectifiers in power electronic circuits, such as switch mode power supplies. Examples of power semiconductor devices include, but are not limited to, a superjunction MOSFET, a superjunction metal-semiconductor field-effect transistor (MESFET), a superjunction Schottky diode, a superjunction insulated-gate bipolar transistor (IGBT), a thyristor, and a superjunction pn diode.

Superjunction semiconductor devices according to preferred embodiments of the present invention include high voltage semiconductor devices and power semiconductor devices.

Figure 1B:
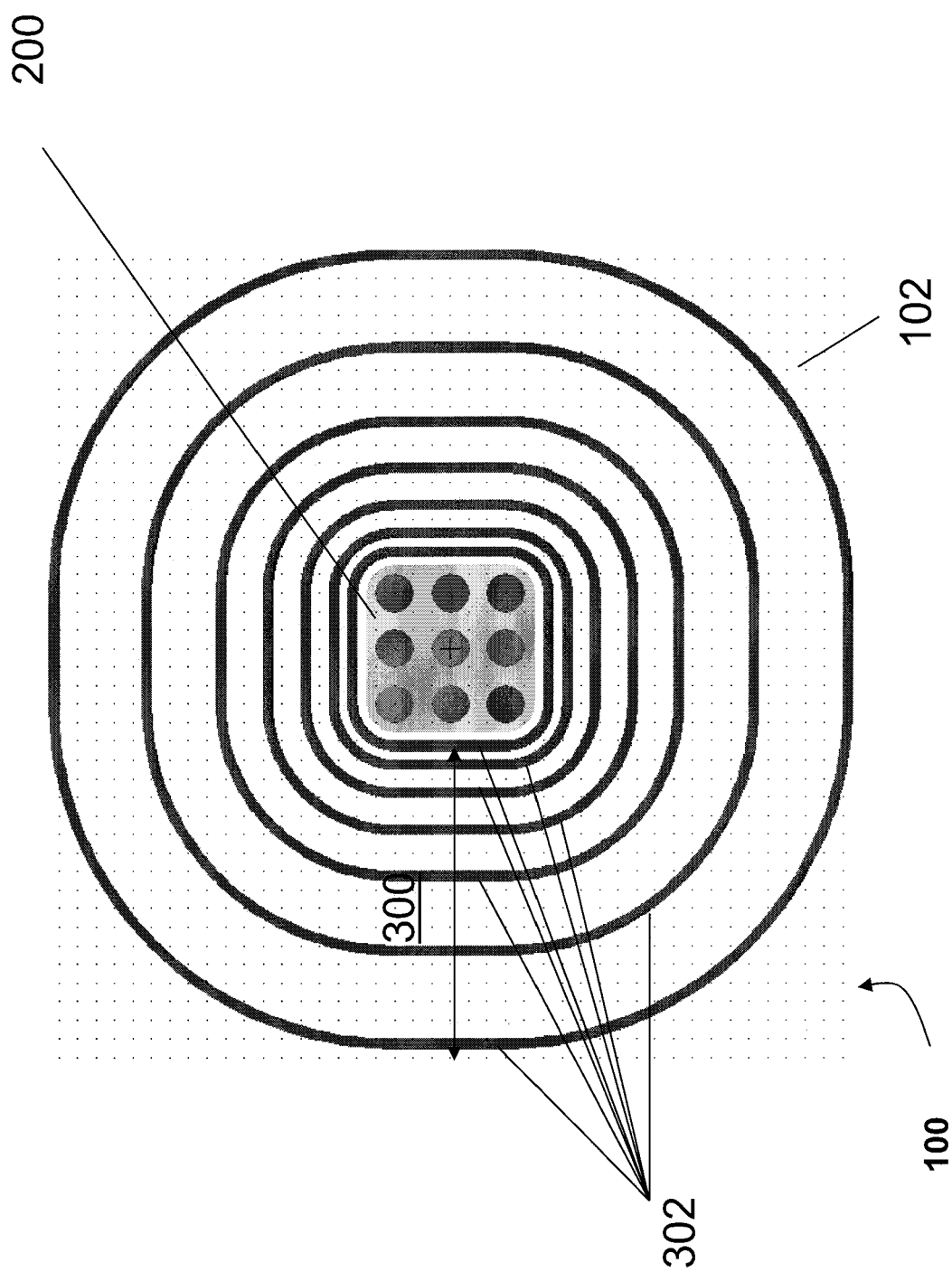
FIG. 1B is a top plan view of the superjunction semiconductor diode of FIG. 1A.

FIGS. 1A and 1B schematically illustrate a superjunction semiconductor device 100 that has a prior art multiple field limiting ring (FLR) termination. Referring to FIG. 1A, the semiconductor device 100 includes a semiconductor substrate 102 situated on a copper slog of leadframe 104 and encapsulated by a package inner layer/underfilling 106. A plastic molding compound 108 further encapsulates the package inner layer 106 and the copper slog of leadframe 104. The semiconductor substrate has an active region 200, also called the die region, and a surrounding termination region 300. Referring to FIG. 1B, the termination region 300 includes multiple FLRs 302. Each FLR 302 uses the semiconductor substrate 102 to support the electric field. The higher the device voltage, the larger is the proportion of termination region 300 to the active region 200. Therefore, the termination region can consume a relatively large amount of the surface area for high voltage devices.

Figure 2A:
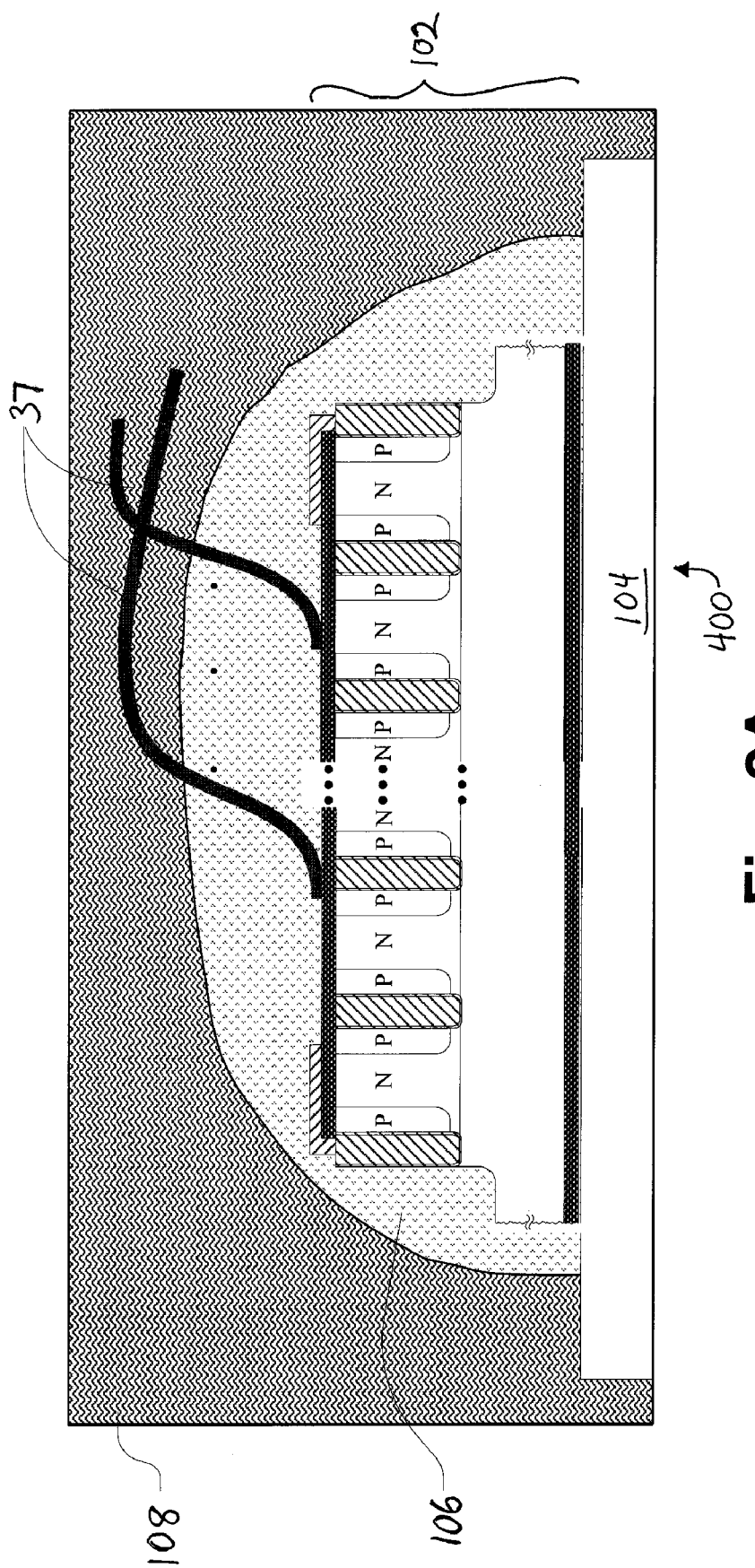
FIG. 2A is a schematic cross-section view of a superjunction semiconductor diode according to an embodiment of the present invention, the semiconductor device having a termination structure that comprises part of the package.

FIGS. 2A and 2B schematically illustrate a superjunction semiconductor device 400 in accordance with preferred embodiments of the present invention. The semiconductor device 400 includes a semiconductor substrate 102 situated on a copper slog of leadframe 104 and encapsulated by a package inner layer/underfilling 106. A plastic molding compound 108 further encapsulates the package inner layer/underfilling 106 and the copper slog of leadframe 104. The semiconductor substrate 102 includes essentially the active region 200, and does not contain the FLR termination structure shown in FIGS. 1A and 1B. The dielectric package inner layer/underfilling 106 dissipates the surface electric field and serves the termination function.

Unlike the prior art multiple FLR termination structure shown in FIGS. 1A and 1B, the termination structure according to embodiments of the present invention is a layer of dielectric of an effective thickness and consumes about 0% of the surface area of the semiconductor substrate. In one embodiment, the a first surface of the termination structure is proximate to the at least one column of the second conductivity type and an opposing second surface of the termination structure is in direct contact with the material that encapsulates the semiconductor substrate.

Figures 3A, 3B:
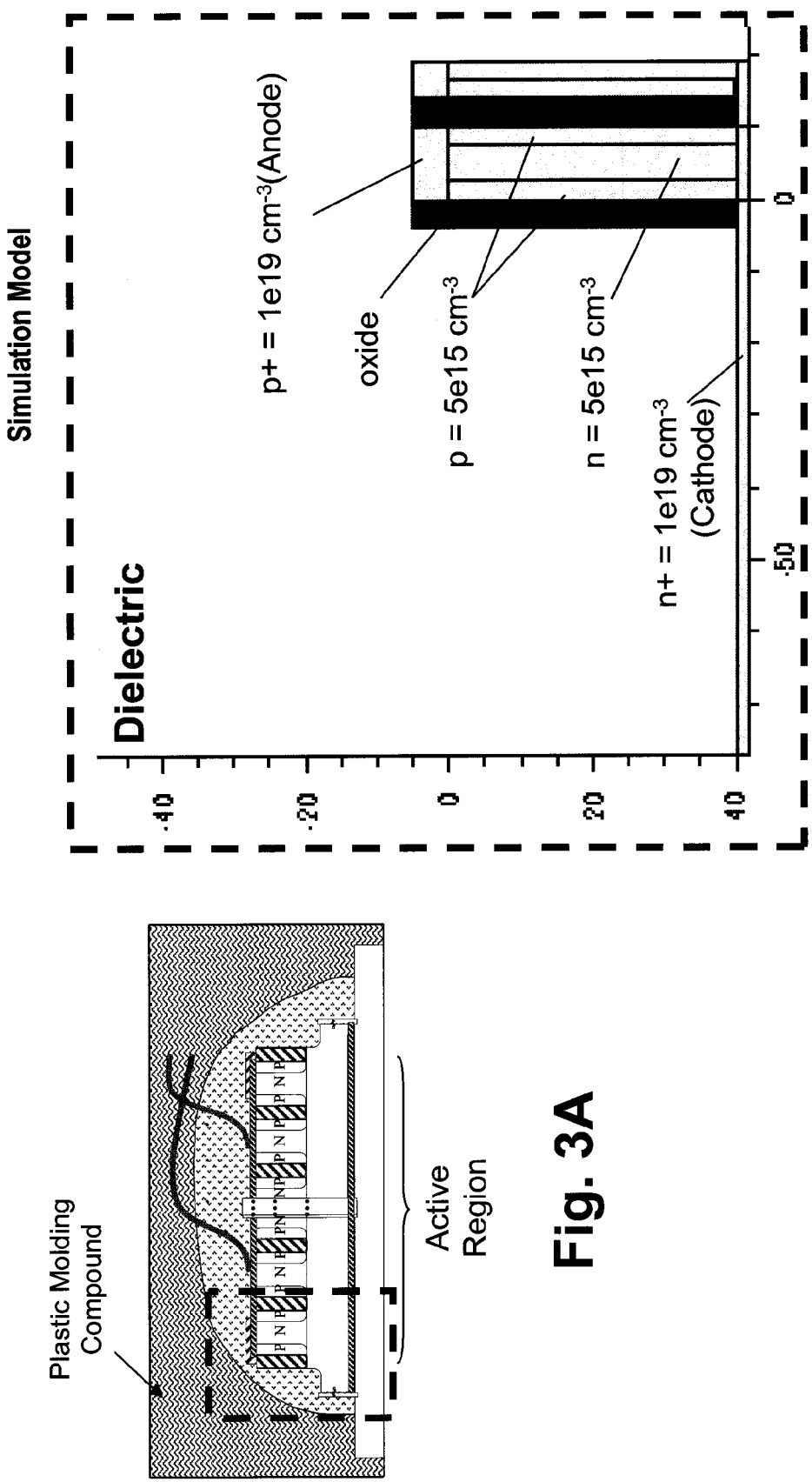
FIG. 3A shows a simulation model of a semiconductor diode according to preferred embodiments of the present invention.
FIG. 3B is a partial view of the simulation model of FIG. 3A placed on a coordinate system showing dimensions in units of microns.

FIGS. 3A and 3B illustrate the generation of a simulation model of a semiconductor device in accordance with embodiments of the present invention. Not only is the edge portion of the semiconductor substrate reproduced in the simulation model, but the surrounding region of package materials is also included. The structural data shown in FIG. 3B includes the typical values for a 500V-rated high-voltage superjunction device design, which is used here as an example to show the effectiveness of a preferred embodiment of the present invention.

FIGS. 4A, 4B and 4C illustrate the simulation results. FIG. 4A shows that a superjunction semiconductor device having a termination structure according to a preferred embodiment provides a simulated breakdown voltage of about 605.6 V. FIGS. 4B and 4C demonstrate that when the device is at the high voltage of 605.6V, the electric field is dissipated within a 150 µm region around the die, with a margin of about several tens of microns. Therefore, in preferred embodiments, the termination structure includes a layer of dielectric with a thickness of at least about 150 micrometers (µm). Most of the packages have a thickness much greater than 150 µm and are therefore adequate to serve the function of a termination structure.

Figure 5:
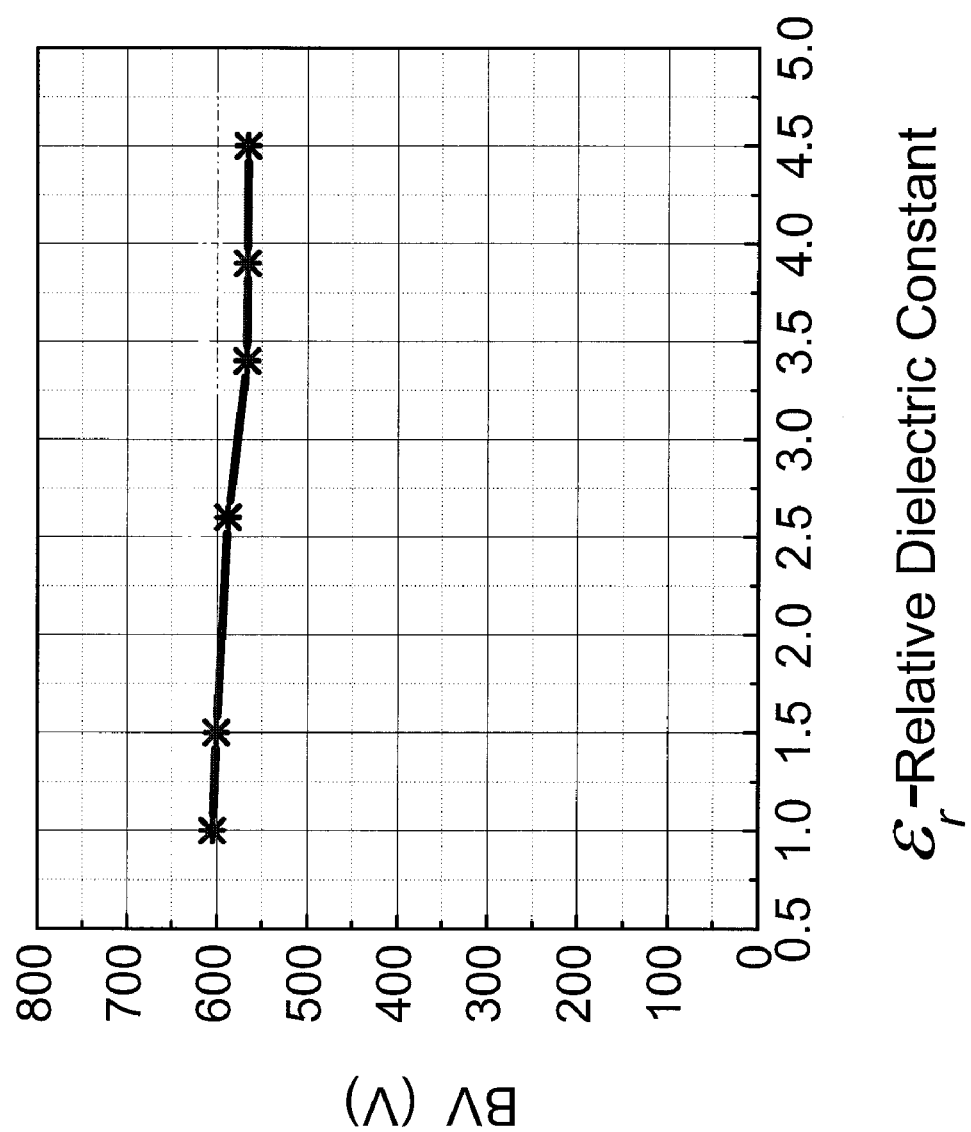
FIG. 5 shows the simulated breakdown voltages of a semiconductor device having an edge termination structure according to an embodiment of the present invention, as a function of the relative dielectric constant.

FIG. 5 illustrates the simulated breakdown voltages as a function of the relative dielectric constant of the dielectric material that makes up the dielectric termination region. The simulated breakdown voltage shows little change within the range of the dielectric constant from about 1 to about 3.4. At dielectric constants above 3.4, there is almost no change in the breakdown voltage. Therefore, almost any of the various dielectric materials available can be used to form the dielectric termination structure. Examples of such dielectric materials include, but are not limited to, air, filling gases (inert gases), vacuum, glass, ceramic, epoxy, and other various underfilling materials and molding compound plastics. The dielectric termination can also be formed using a combination of any two or more of the dielectric materials.

Figure 6:
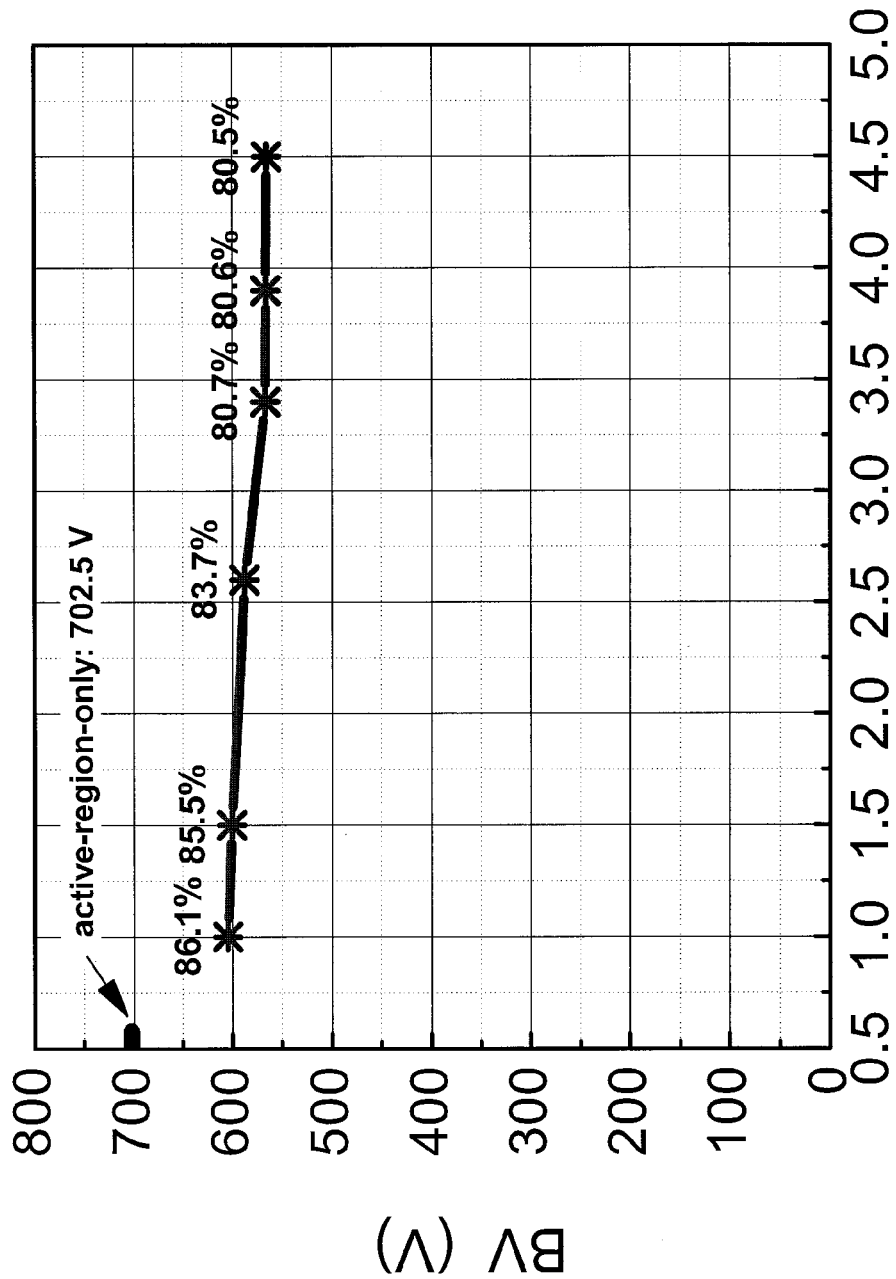
FIG. 6 shows the simulated termination efficiency of an edge termination structure according to an embodiment of the present invention, as a function of the relative dielectric constant.

FIG. 6 illustrates the simulated termination efficiency as a function of the relative dielectric constant. The ideal value of the breakdown voltage is the breakdown voltage when simulated over a structure with infinite periodic active regions and no existing termination regions. Of course, there is no infinitely large semiconductor chip. The breakdown voltage is therefore lowered due to the termination of the active region. A deliberately designed termination structure can alleviate the decrease in breakdown voltage. Thus, the efficiency of a termination design is evaluated by a ratio between the breakdown voltage of the actual device and the ideal breakdown voltage. As shown in FIG. 6, a dielectric termination region in accordance with embodiments of the present invention has an efficiency between about 80%-86%, depending on the dielectric constant of the package materials used. Such termination efficiency is comparable to that of the multiple FLR termination of the prior art.

The dielectric termination structure according to embodiments of the present invention dissipates the electric field in a region outside of the semiconductor substrate. It consumes approximately 0% of the surface area of the semiconductor substrate to achieve a breakdown voltage of about 604 V and more than 80% termination efficiency. This is in direct contrast with the multiple FLR termination of the prior art, which dissipates the electric field in the peripheral region of the semiconductor substrate outside of the active region, and consumes about 150 µm on each side of the semiconductor substrate to realize a breakdown voltage of about 520 V. By using a dielectric termination structure according to embodiments of the present invention, the semiconductor substrate can now be essentially entirely employed as the active region. This results in a higher yield and a lower on-state voltage. In addition, as described below, simpler processing steps can be used for the manufacture of a semiconductor device with the dielectric termination structure.

Figure 7A:
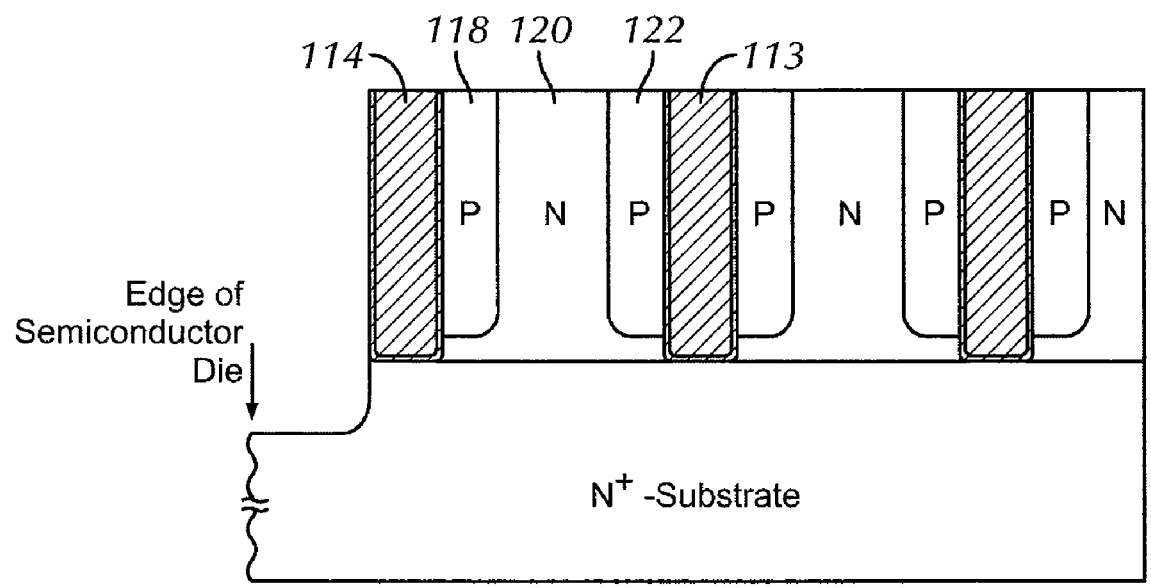
FIG. 7A is a schematic cross-sectional elevational view of a first basic structure, fabricated by a trench/implant fabrication process, that can be used in preferred embodiments of the present invention, the basic structure having a unit cellular structure, in the order of a trench filled with at least one dielectric material, a first column of p conductivity type, a column of n conductivity type, and a second column of p conductivity type.
Figure 7B:
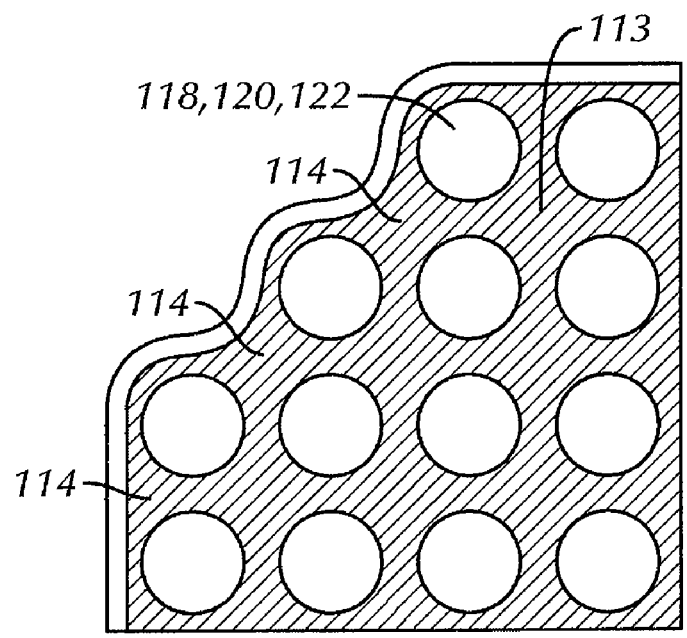
FIG. 7B shows one possible top plan view of the first basic structure of FIG. 7A.

Referring to FIGS. 7A and 7B, a basic structure manufactured by a trench fabrication process is shown for use in a preferred embodiment of the present invention. The basic structure has a unit cellular structure, in the order of a trench filled with at least one dielectric material, 113 or 114, a first column 118 of p conductivity type, a column 120 of n conductivity type, and a second column 122 of p conductivity type. Filled trenches 114 proximate the peripheral portion of the semiconductor substrate can function as at least a part of the termination structure. The termination structure can further include one or more additional layers of dielectric, such as the package inner layer/underfilling or molding compound for the device.

Figure 8A:
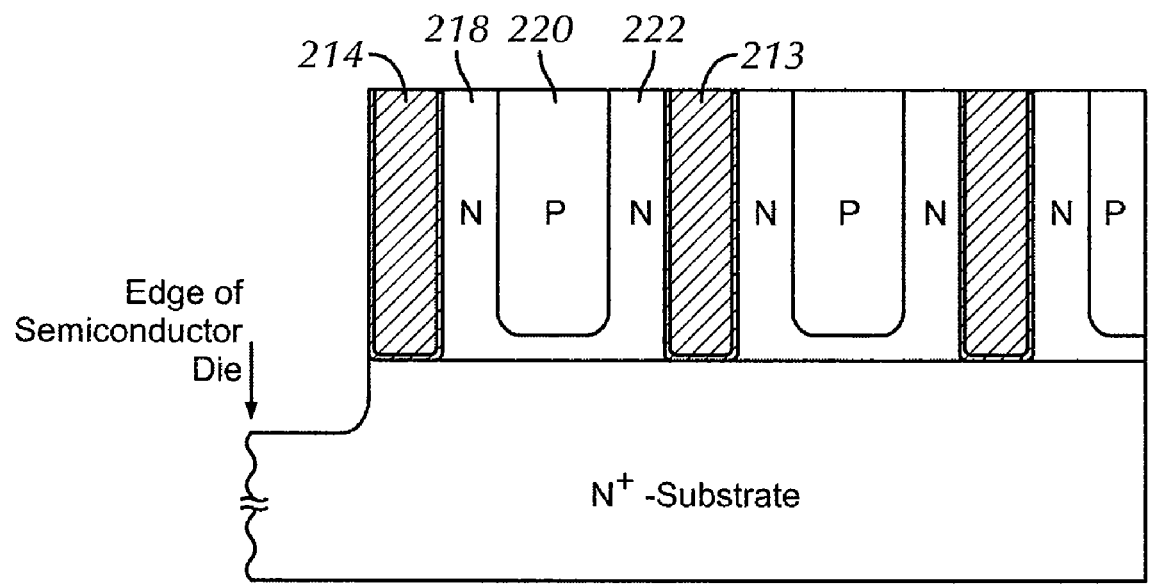
FIG. 8A is a schematic cross-sectional elevational view of a second basic structure, fabricated by a trench/implant fabrication process, that can be used in preferred embodiment of the present invention, the basic structure having a unit cellular structure, in the order of a trench filled with at least one dielectric material, a first column of n conductivity type, a column of p conductivity type, and a second column of n conductivity type.
Figure 8B:
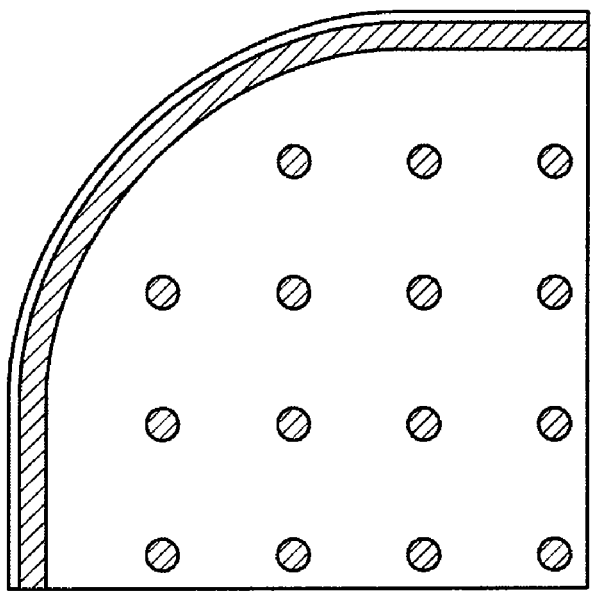
FIG. 8B shows one possible top plan view of the second basic structure of FIG. 8A.

Referring to FIGS. 8A and 8B, another basic structure manufactured by a trench fabrication process is shown for use in another preferred embodiment of the present invention. The basic structure has a unit cellular structure, in the order of a trench filled with at least one dielectric material, 213 or 214, a first column 218 of n conductivity type, a column 220 of p conductivity type, and a second column 222 of n conductivity type. Filled trenches 214 proximate the peripheral portion of the semiconductor substrate can function as at least a part of the termination structure. The termination structure can further include one or more additional layers of dielectric, such as the package inner layer/underfilling or molding compound for the device.

Figure 9B:
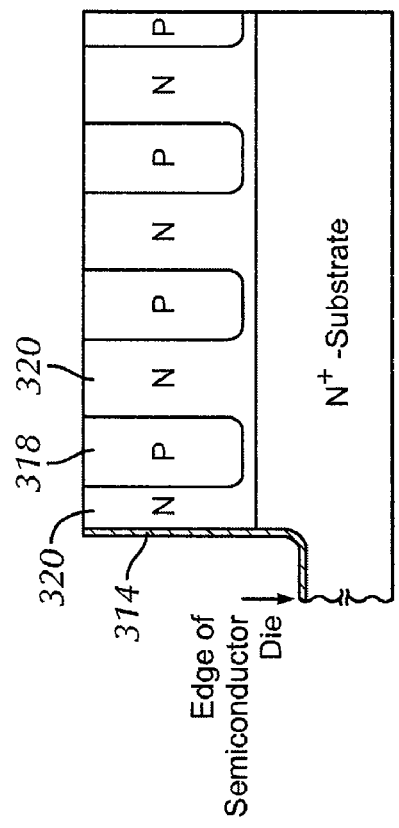
FIG. 9B is a schematic cross-sectional elevational view of a basic structure, for use in preferred embodiments, having a passivation layer and a unit cellular structure in the order of a first column of n conductivity type, a column of p conductivity type, and a second column of n conductivity type, fabricated by a trench/epi-refill process.
Figure 9D:
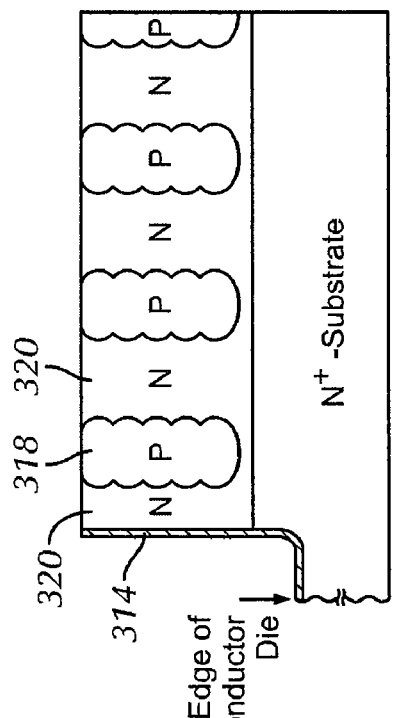
FIG. 9D is a schematic cross-sectional elevational view of a basic structure, for use in preferred embodiments, having a passivation layer and a unit cellular structure in the order of a first column of n conductivity type, a column of p conductivity type, and a second column of n conductivity type, fabricated by a multi-epi/implant process.
Figure 9A:
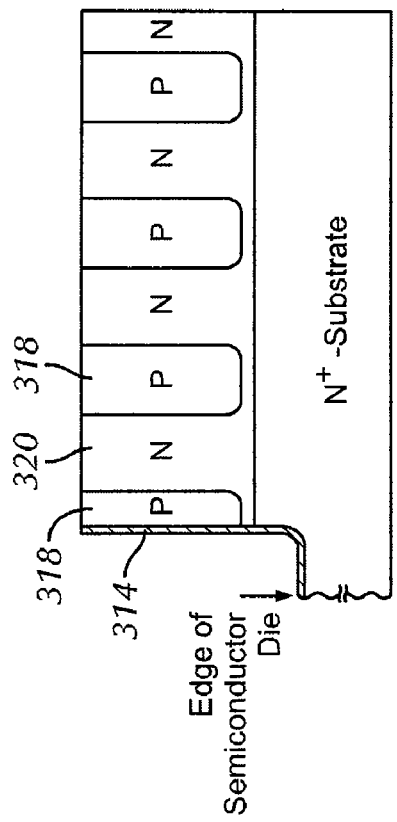
FIG. 9A is a schematic cross-sectional elevational view of a basic structure, for use in preferred embodiments, having a passivation layer and a unit cellular structure in the order of a first column of p conductivity type, a column of n conductivity type, and a second column of p conductivity type, fabricated by a trench/epi-refill process.

FIGS. 9A-9D illustrate additional examples of basic structures for use in preferred embodiments. These basic structures have a passivation layer 314 proximate a peripheral portion of the semiconductor substrate. The passivation layer 314 can function as at least a part of the termination structure. The termination structure can further include one or more additional layers of dielectric, such as the package inner layer/underfilling or molding compound for the device. The basic structure can have a unit cellular structure having a column 320 of n conductivity type and a column 318 of p conductivity type fabricated by a trench-epi-process (FIG. 9A); a column 318 of p conductivity type and a column 320 of n conductivity type, fabricated by a trench-epi-process (FIG. 9B); a column 318 of p conductivity type and a column 320 of n conductivity type, fabricated by a multi-epi-process (FIG. 9C); and a column 320 of n conductivity type and a column 318 of p conductivity type, fabricated by a multi-epi-process (FIG. 9D).

The basic structures described above can be applied to any superjunction semiconductor device. Such a superjunction semiconductor device may be a superjunction MOSFET, a superjunction MESFET, a superjunction Schottky diode, a superjunction IGBT, a thyristor, a superjunction pn diode, and the like.

Figure 10:
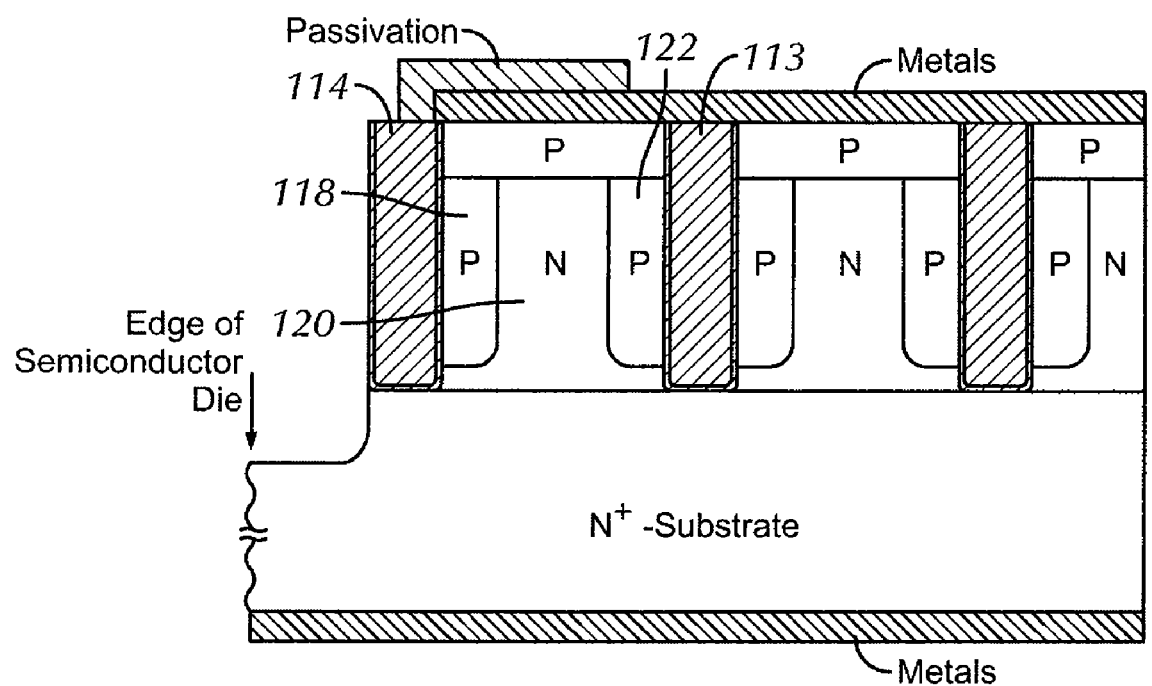
FIG. 10 is a schematic cross-sectional elevational view of a pn diode having the basic structure of FIGS. 7A and 7B.
Figure 11A:
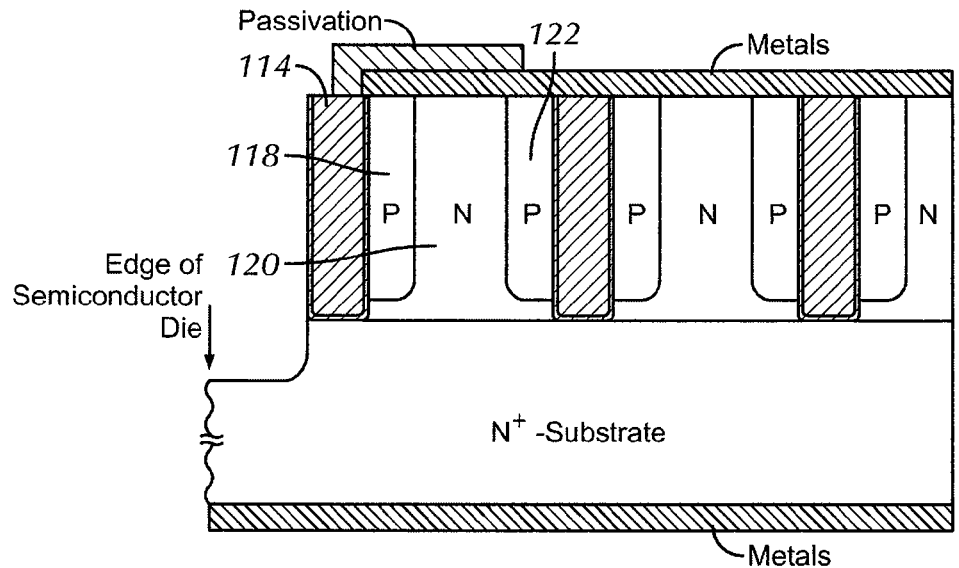
FIG. 11A is a schematic cross-sectional elevational view of a Schottky diode having the basic structure of FIGS. 7A and 7B in a chip form.
Figure 11B:
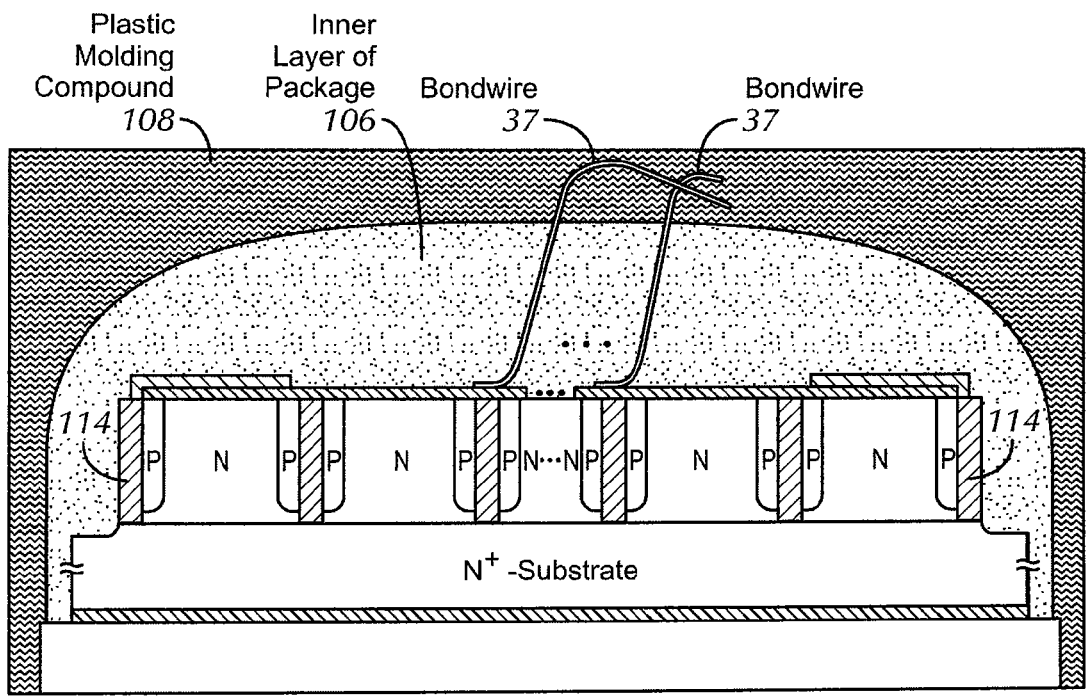
FIG. 11B is a schematic cross-sectional elevational view of a Schottky diode having the basic structure of FIGS. 7A and 7B in a packaged form.
Figure 12A:
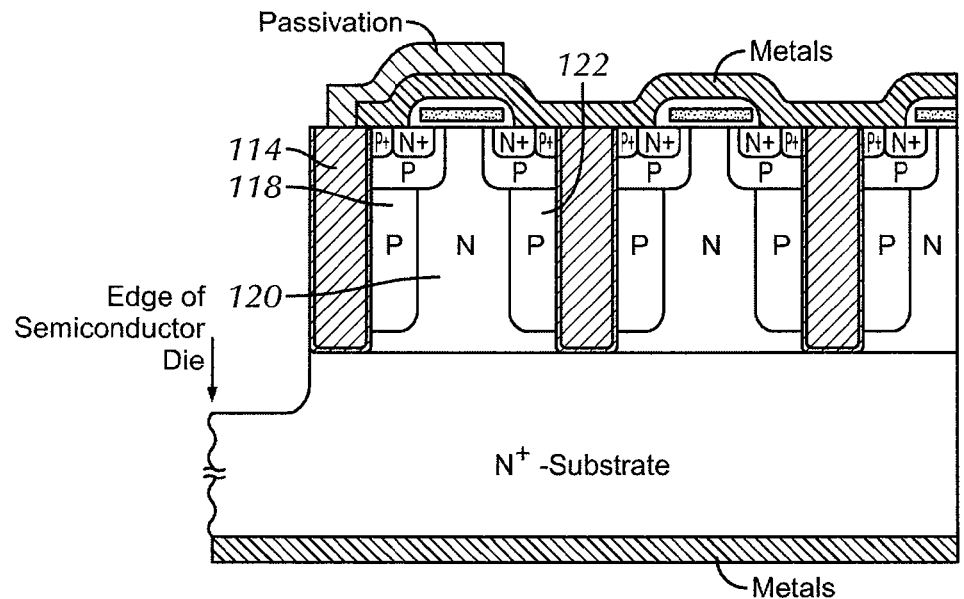
FIG. 12A is a schematic cross-sectional elevational view of a power MOSFET having the basic structure of FIGS. 7A and 7B in a chip form.
Figure 12B:
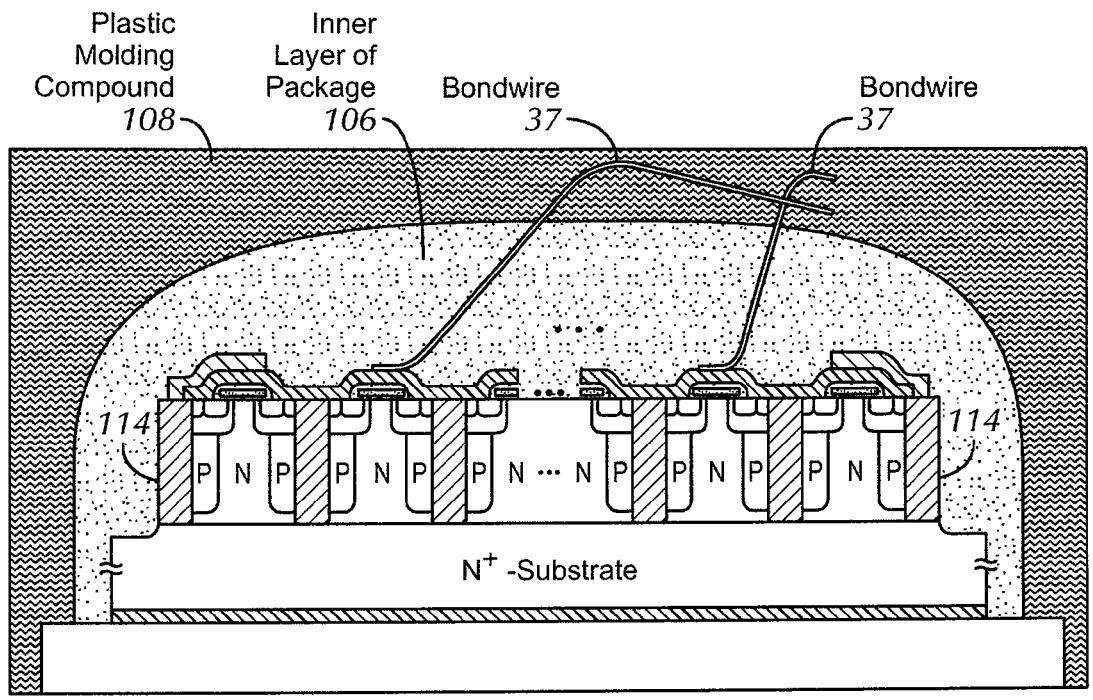
FIG. 12B is a schematic cross-sectional elevational view of a power MOSFET having the basic structure of FIGS. 7A and 7B in a packaged form.
Figure 13:
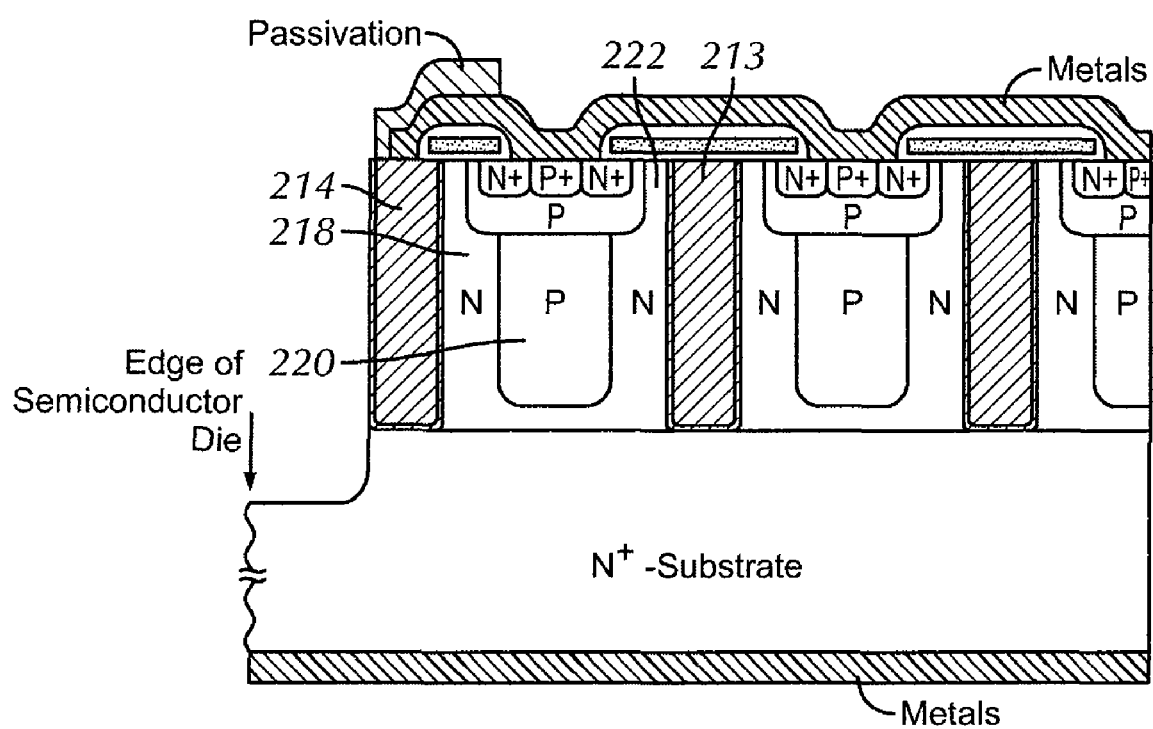
FIG. 13 is a schematic cross-sectional elevational view of a power MOSFET having the basic structure of FIGS. 8A and 8B.

FIGS. 10-12 illustrate a pn diode, a Schottky diode, and a power MOSFET respectively, having the basic structure as shown in FIGS. 7A and 7B. FIG. 13 illustrates a power MOSFET having a basic structure as shown in FIGS. 8A and 8B. In each of the devices of FIGS. 10-13, a trench filled with at least one dielectric material 114, 214 proximate the peripheral region of the semiconductor substrate functions as at least a part of the termination structure. Additional voltage termination function is provided by the package inner layer/underfilling 106 or the molding compound 108.

Figure 9C:
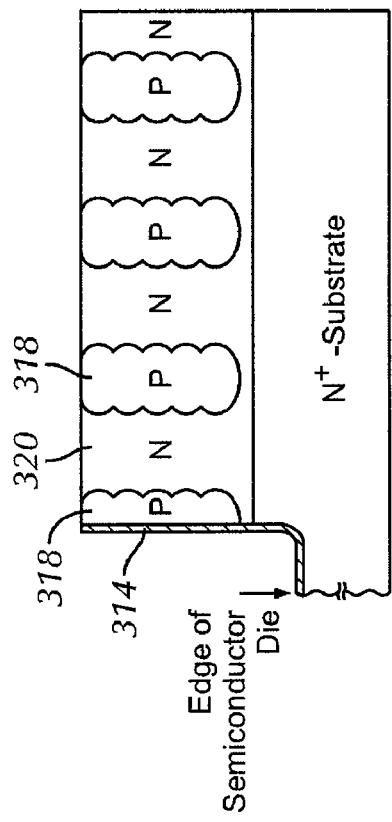
FIG. 9C is a schematic cross-sectional elevational view of a basic structure, for use in preferred embodiments, having a passivation layer and a unit cellular structure in the order of a first column of p conductivity type, a column of n conductivity type, and a second column of p conductivity type, fabricated by a multi-epi/implant process.
Figure 14A:
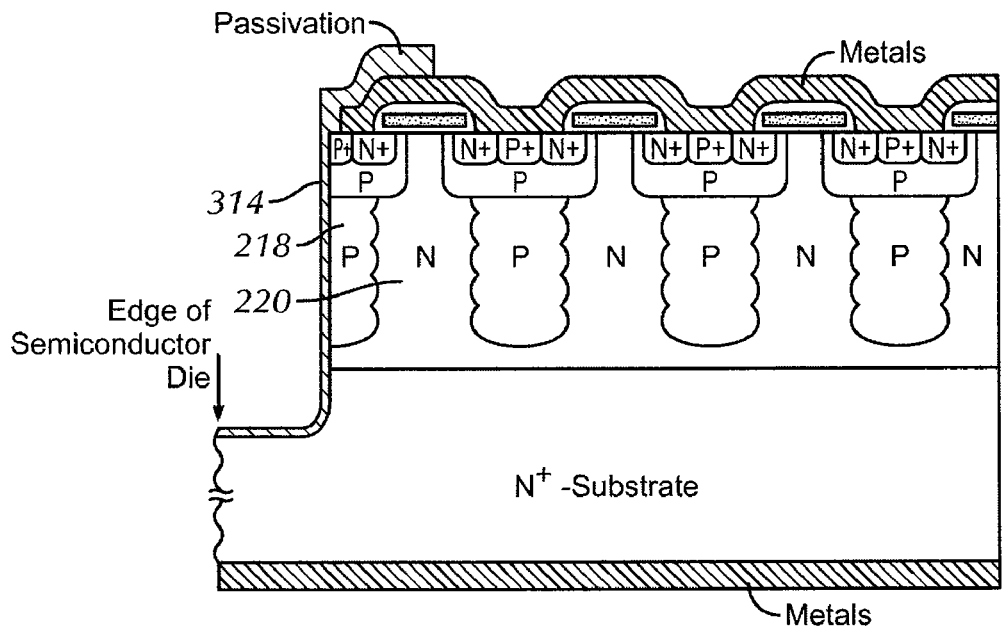
FIG. 14A is a schematic cross-sectional view of a power MOSFET having the basic structure of FIG. 9C in a chip form.
Figure 14B:
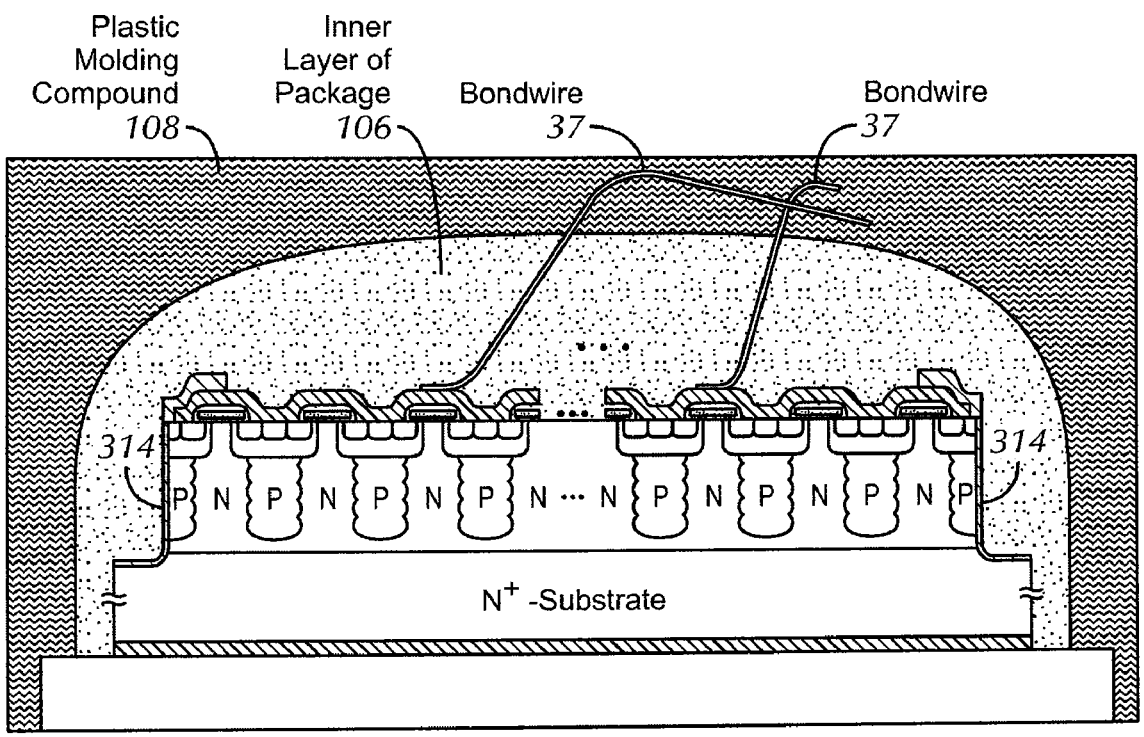
FIG. 14B is a schematic cross-sectional view of a power MOSFET having the basic structure of FIG. 9C in a packaged form.

FIGS. 14A and 14B illustrate a power MOSFET having the basic structure as shown in FIG. 9C. The passivation layer 314 proximate the peripheral portion of the semiconductor substrate functions as at least a part of the termination structure. Additional voltage termination function is provided by the package inner layer/underfilling 106 or the molding compound 108.

FIGS. 15-36 illustrate a trench type process for manufacturing a superjunction Schottky diode in accordance with a preferred embodiment of the present invention. A Schottky diode has a metal-semiconductor junction with rectifying characteristics. A Schottky diode typically has a very short, if not zero, recovery time in on/off transitions, which makes it very favorable for high speed applications. By using the superjunction structure described above, the breakdown voltage can be significantly improved.

Figure 15:
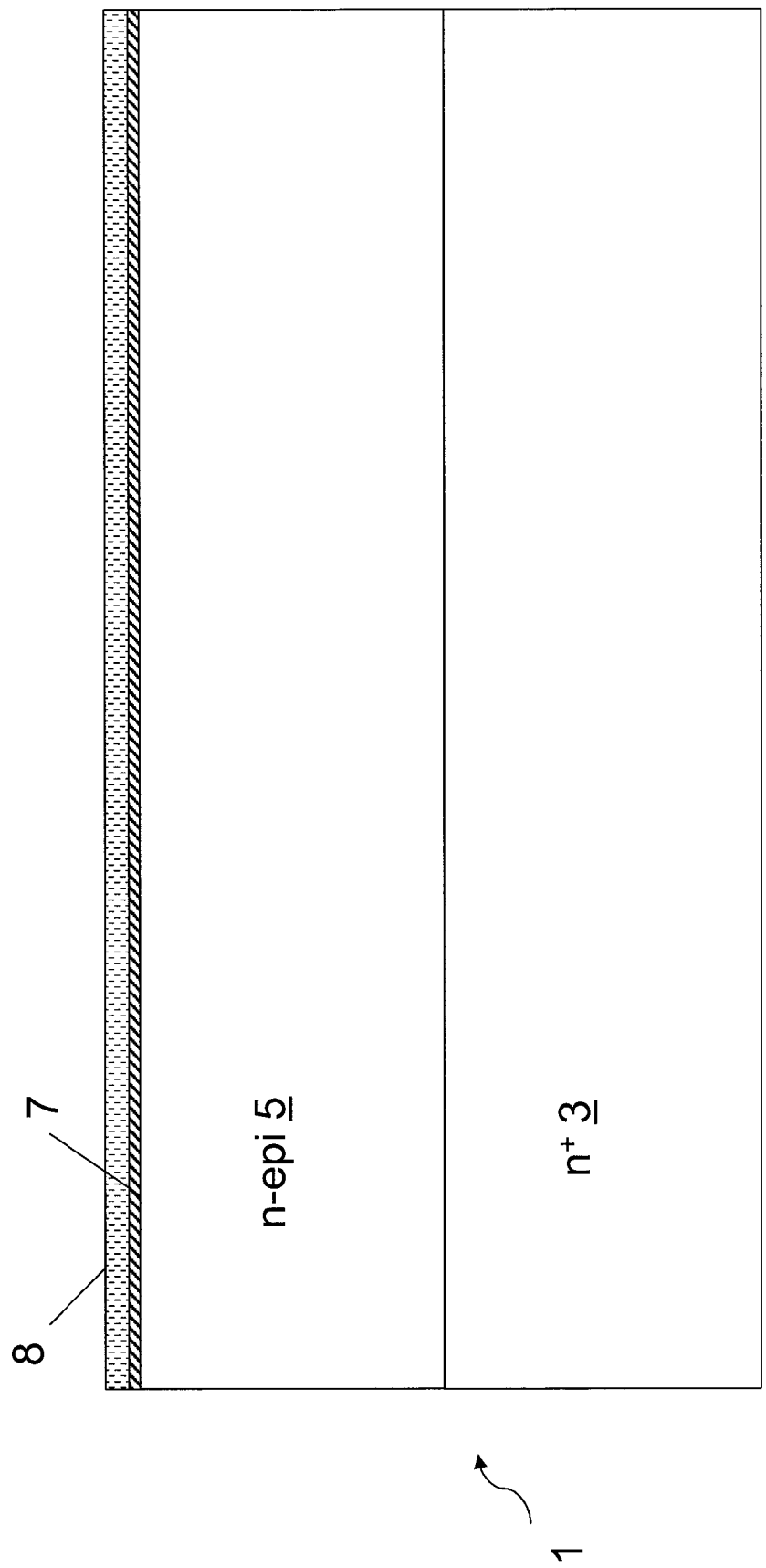
FIG. 15 is a partial cross-sectional elevational view of a silicon substrate having a heavily doped $n^+$ region and a moderately doped n epitaxial layer with a silicon dioxide layer and a silicon nitride layer.

Referring to FIG. 15, a silicon substrate 1 includes a heavily doped $n^+$ region 3 and a lightly doped n epitaxial layer 5. A blocking layer 7 of silicon dioxide is either grown or deposited on the top surface of the epitaxial layer. The blocking layer 7 has a desired thickness of between about 100 to about 1,000 Angstroms (Å). A layer of silicon nitride ($Si_3N_4$) 8 is deposited over the blocking layer 7.

Figure 16:
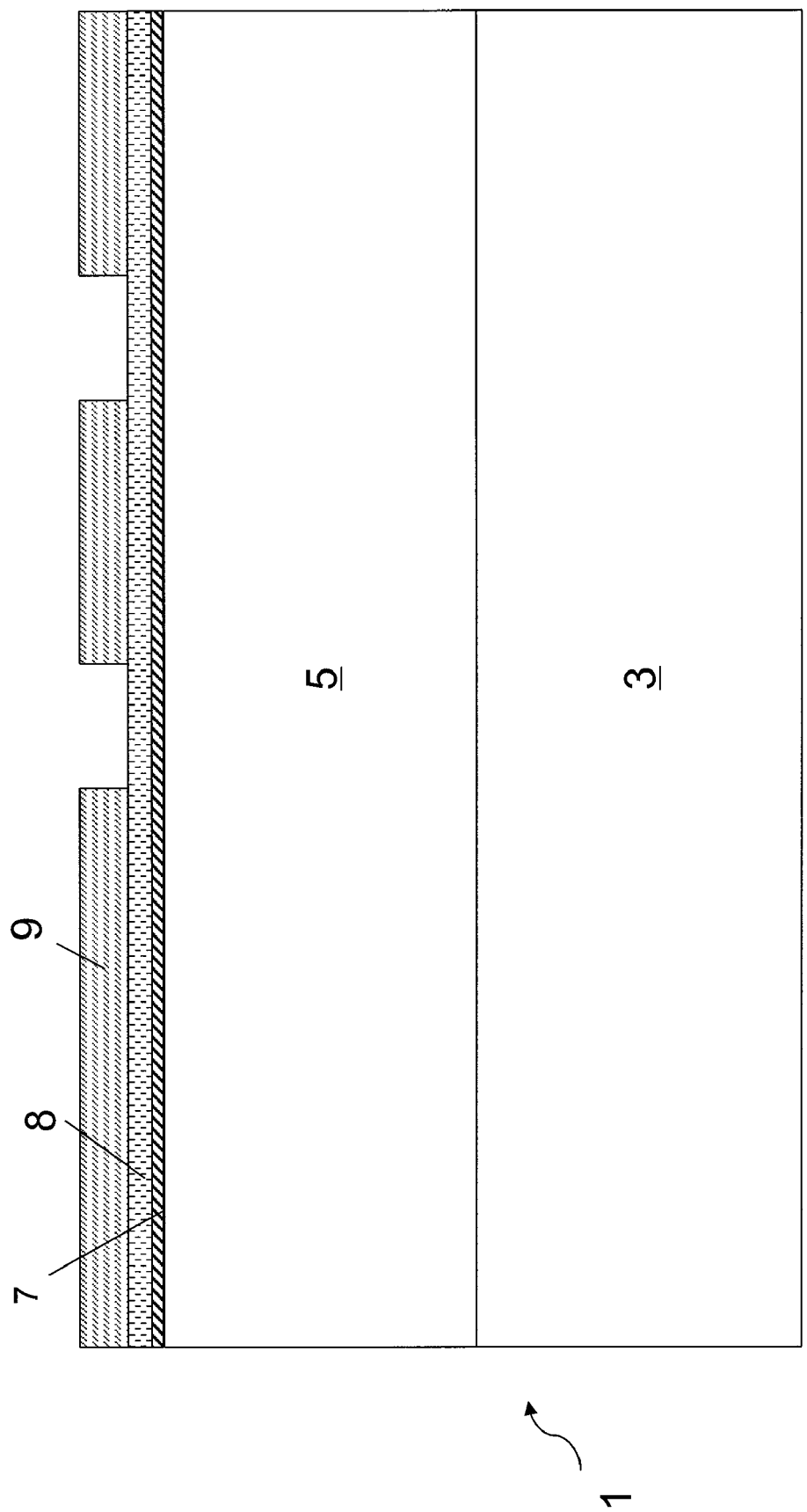
FIG. 16 is a partial cross-sectional elevational view of the semiconductor substrate of FIG. 15 with a photoresist mask.
Figure 17:
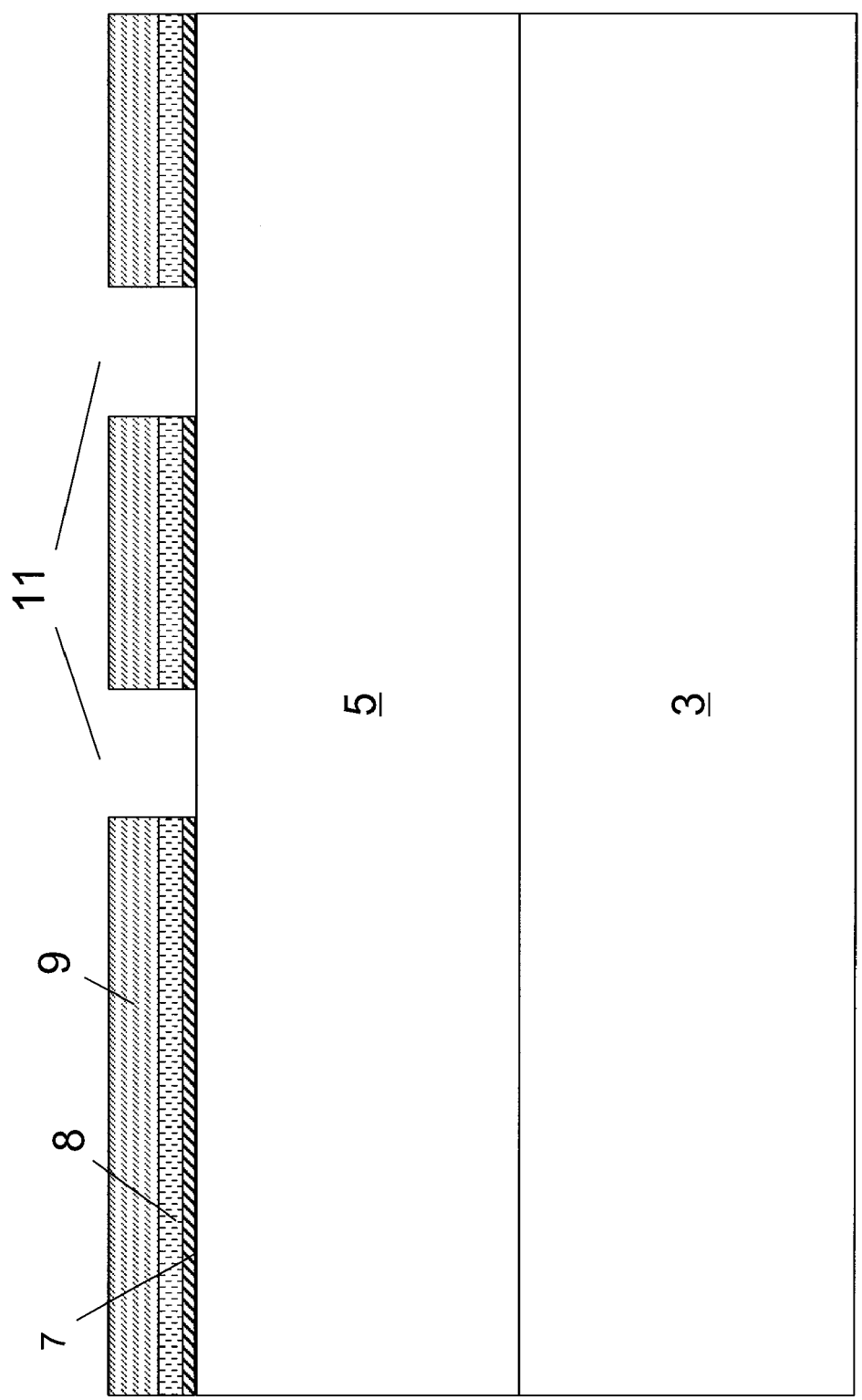
FIG. 17 is a partial cross-sectional elevational view of the semiconductor substrate of FIG. 16 with open windows.
Figure 18:
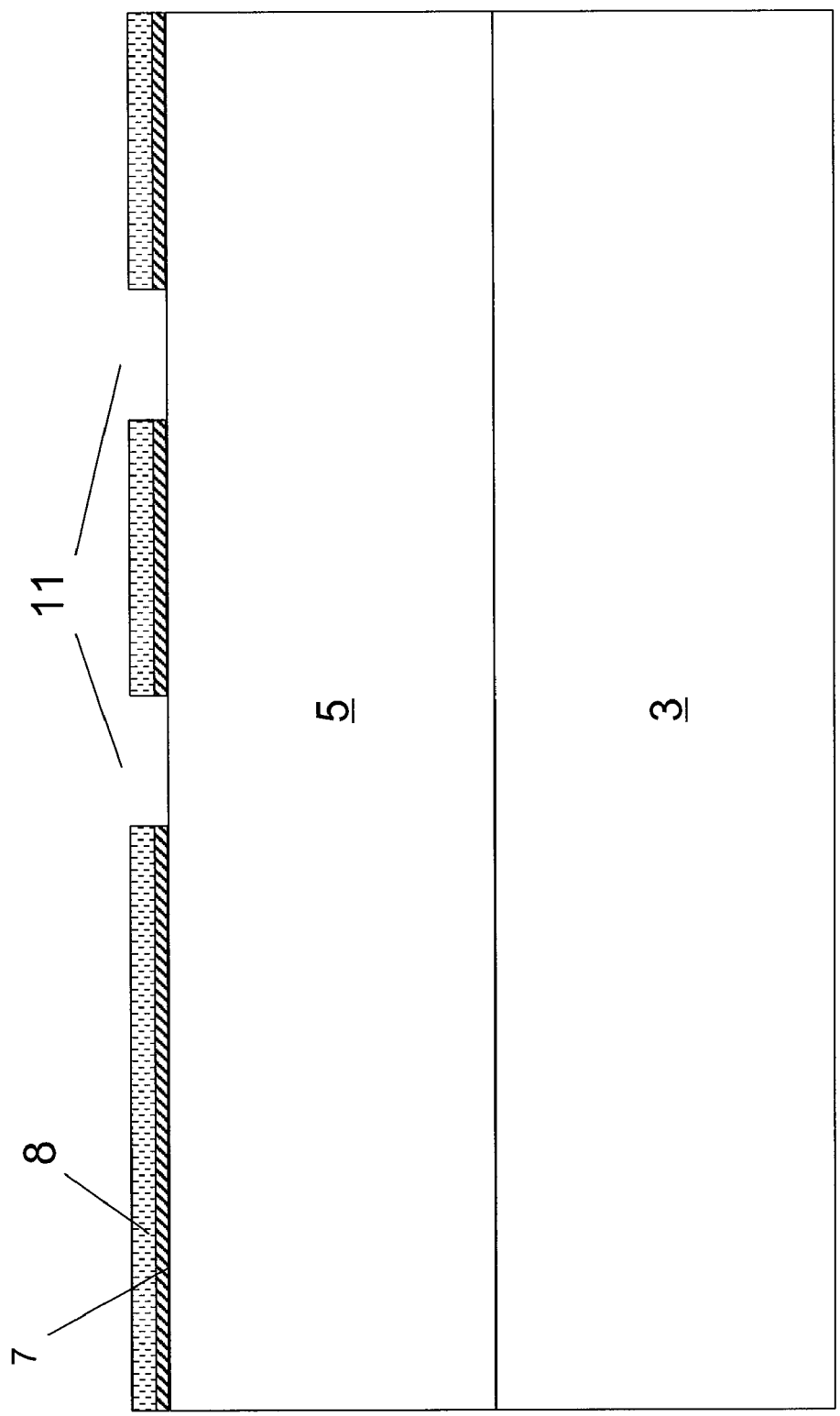
FIG. 18 is a partial cross-sectional elevational view of the semiconductor substrate of FIG. 17 after the photoresist mask is removed.

In FIG. 16, the silicon nitride layer 8 is masked by a photoresist mask 9 to facilitate etching. In FIG. 17, portions of the silicon nitride layer 8 and the blocking layer 7 which are not covered by the photoresist mask 9 are etched by nitride and oxide etching to open spaced apart windows 11 on the layers 7 and 8 for silicon trenches. In FIG. 18, photoresist (PR) stripping is performed to remove the photoresist mask 9.

Figure 19:
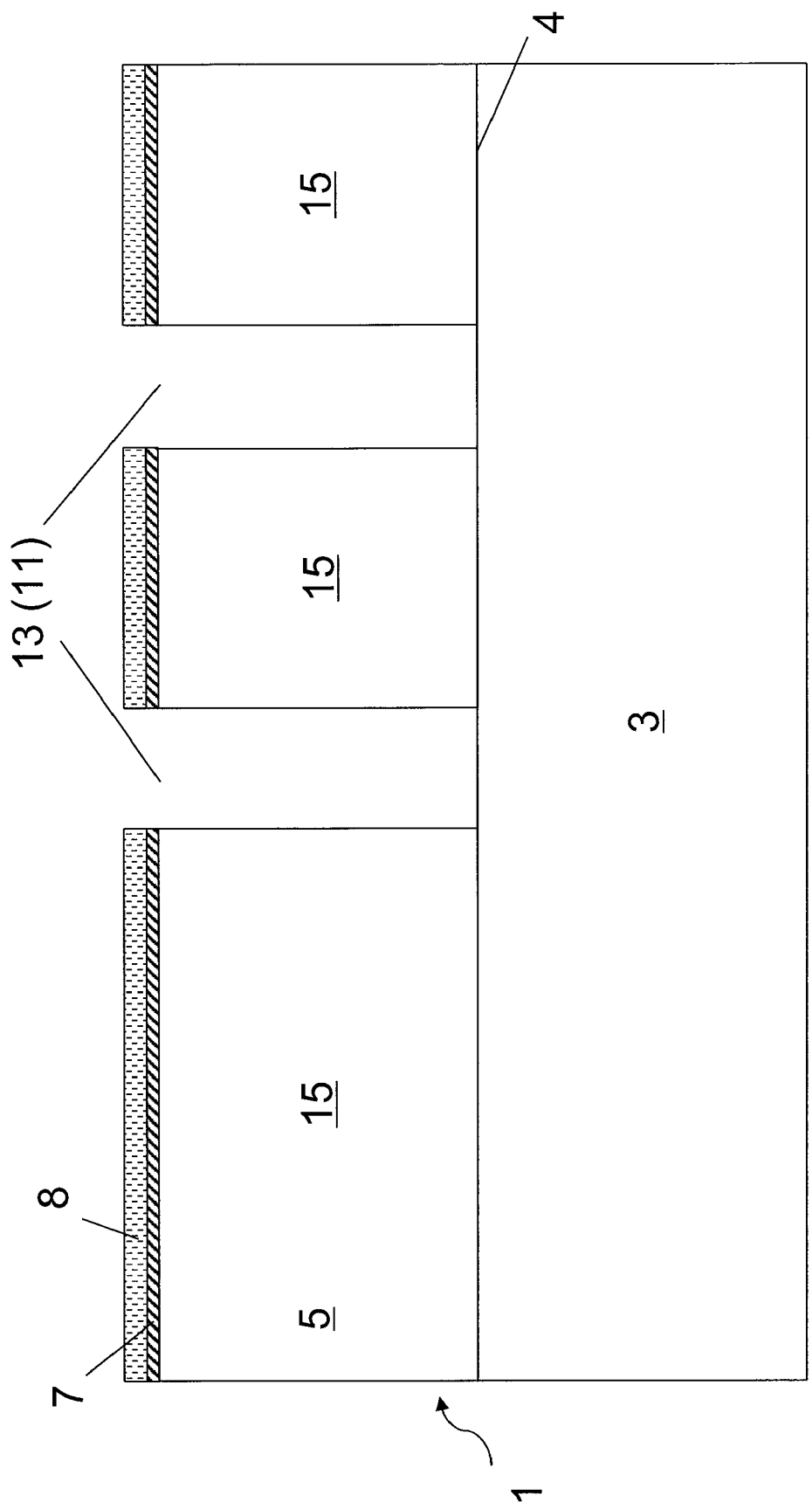
FIG. 19 is a partial cross-sectional elevational view of the semiconductor substrate of FIG. 18 after trenches are formed.

Referring to FIG. 19, using techniques known in the art, the epitaxial layer 5 is etched beneath the windows 11 to form trenches 13 that touch or approach an interface 4 between the heavily doped n+ region 3 and the epitaxial layer 5. Each of the trenches 13 is adjacent to and forms an adjoining mesa 15 of the epitaxial layer 5. The trenches 13 and mesas 15 form the active region of the semiconductor device. Preferably, the etching is performed by utilizing a known technique such as plasma etching, RIE, ICP etching, sputter etching, vapor phase etching, chemical etching, deep RIE, or the like. Utilizing ICP etching, trenches 13 can be formed having depths of about 40 μm to about 300 μm or even deeper. Deep ICP etching technology permits deeper trenches 13 with much straighter sidewalls. Furthermore, forming deeper trenches 13 that have straighter sidewalls than conventionally etched or formed trenches, in addition to other steps in the process, results in a final superjunction device with enhanced avalanche breakdown voltage characteristics as compared to conventional semiconductor-transistor devices (i.e., the avalanche breakdown voltage can be increased to about 200 to 1200 Volts or more).

Figure 20:
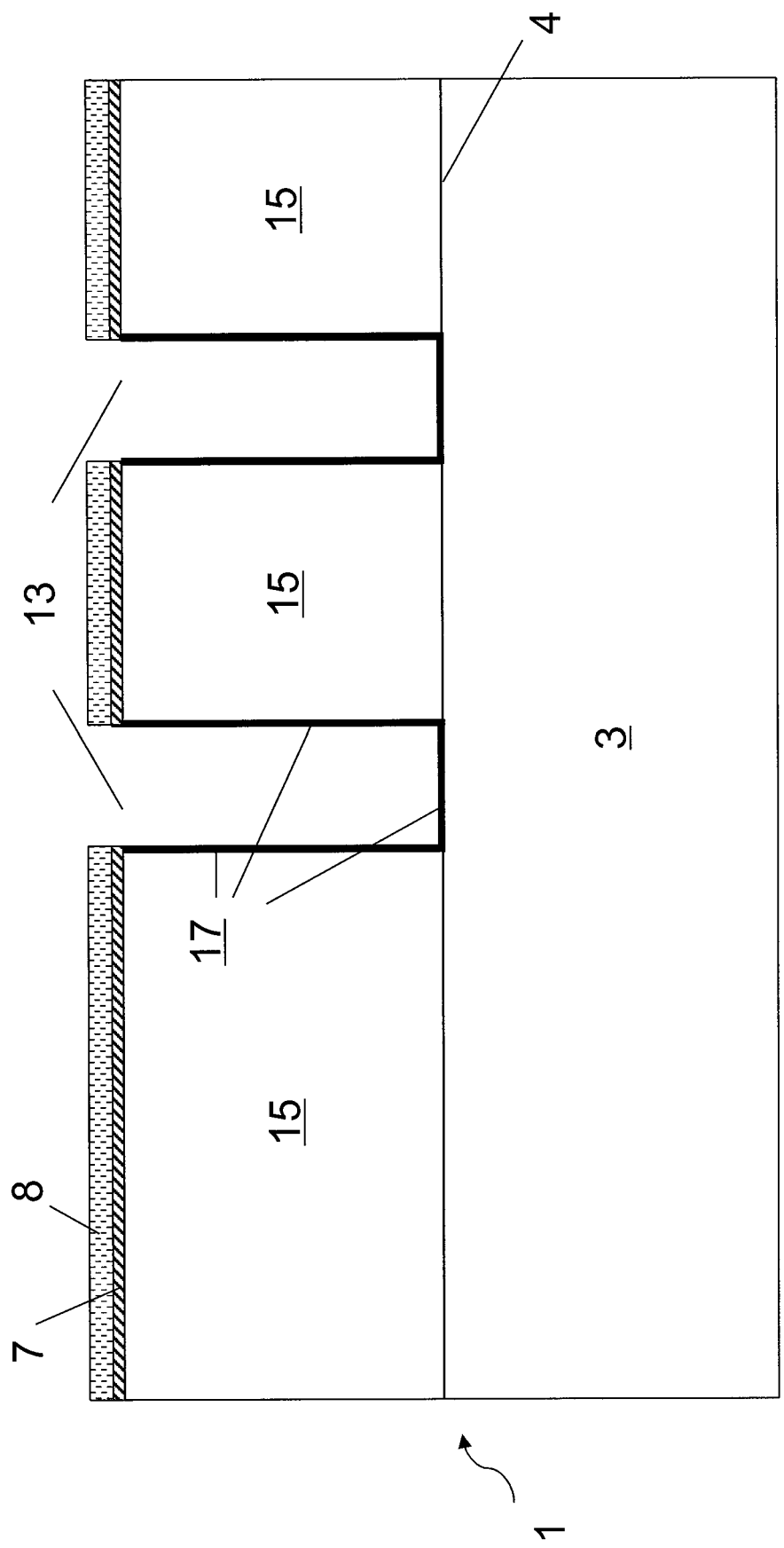
FIG. 20 is a partial cross-sectional elevational view of the semiconductor substrate of FIG. 19 after a sacrificial silicon dioxide layer is grown on the sidewalls and the bottom of the trenches.
Figure 21:
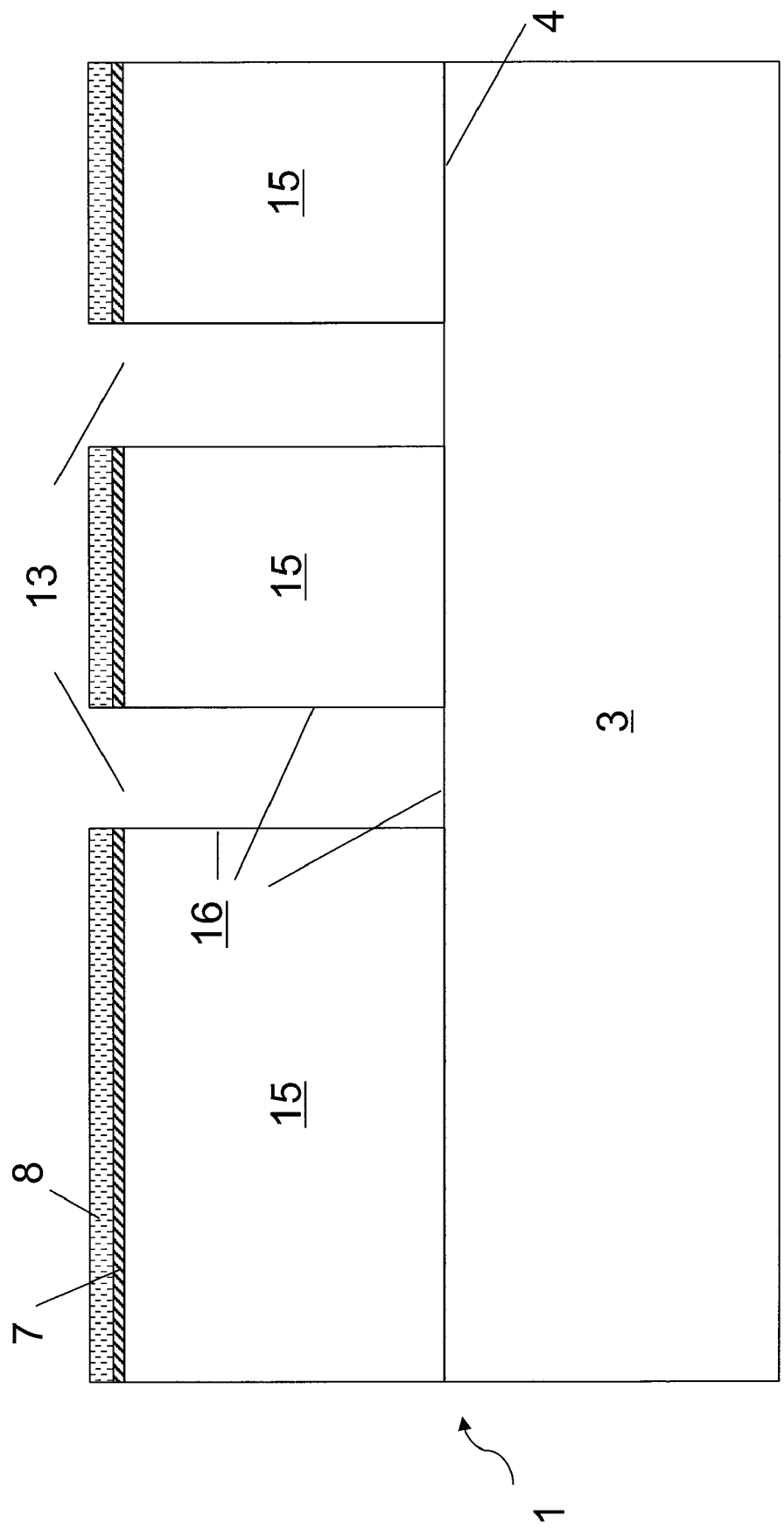
FIG. 21 is a partial cross-sectional elevational view of the semiconductor substrate of FIG. 20 after the sacrificial silicon dioxide layer is subsequently removed, exposing the smoothed surfaces of the sidewalls and bottom of the trenches.

The sidewalls of each trench 13 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. In FIG. 20, a sacrificial silicon dioxide layer 17 is grown on the sidewalls and the bottom of the trenches 13. In FIG. 21, the sacrificial silicon dioxide layer 17 has been subsequently removed, exposing the smoothed surfaces 16 of the sidewalls and bottom of the trenches 13. The use of smoothing techniques can produce smooth trench surfaces with rounded corners while removing residual stress and unwanted contaminates.

Figure 22:
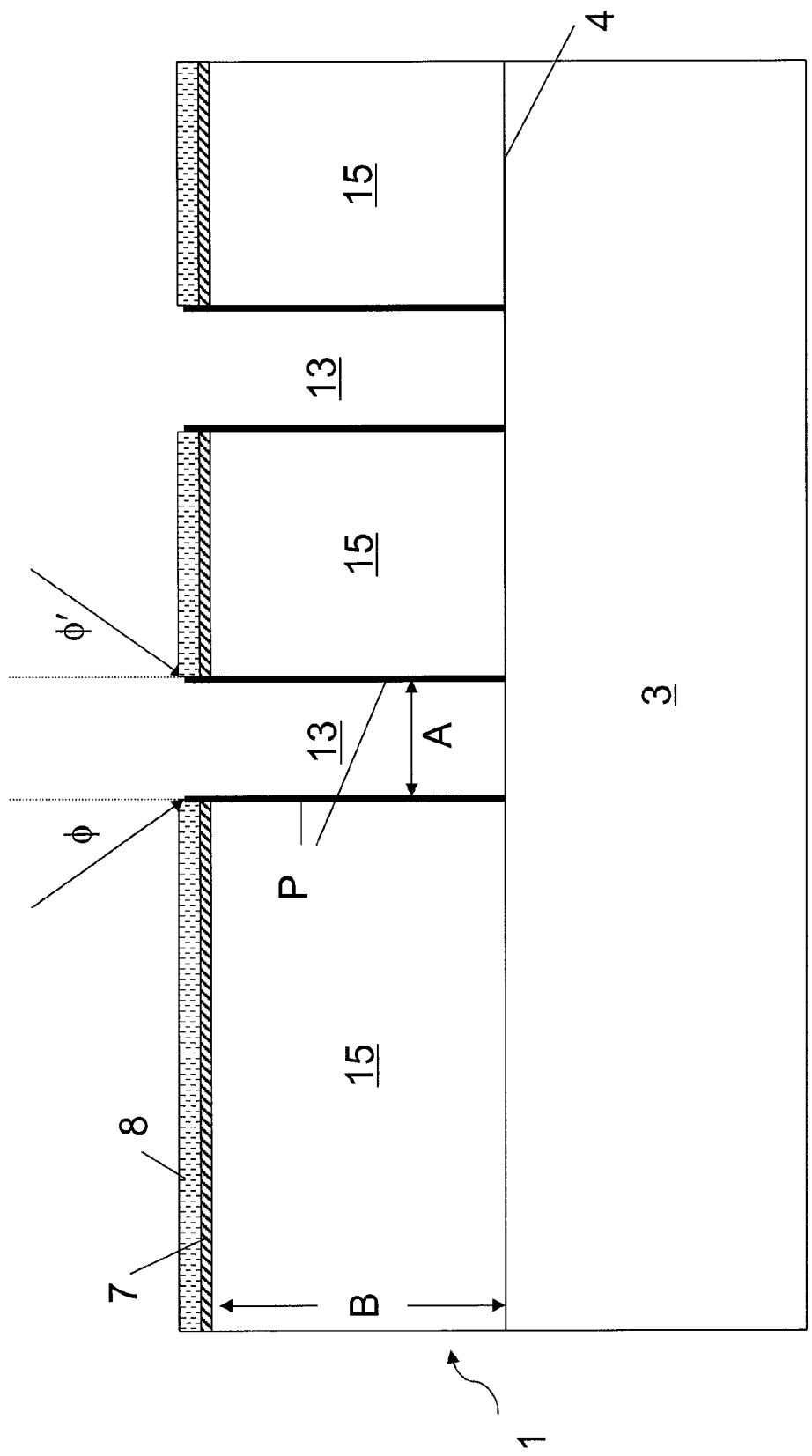
FIG. 22 is a partial cross-sectional elevational view of the semiconductor substrate of FIG. 21 after the sidewall surfaces of the trenches are implanted with a dopant of p conductivity.

Referring to FIG. 22, the width A and depth B of the trenches 13 are used to determine an implantation angle $\phi$, $\phi'$ (i.e., a first or second angle of implantation $\phi$, $\phi'$) of ion implants to be performed and are discussed in detail below. Though not shown clearly, in some embodiments the trenches 13 are preferably slightly wider at their tops by about 1%-10% than at their bottoms to facilitate the trench fill process when the trenches 13 are, for example, to be filled with grown oxide. Consequently, the trenches 13 have a first sidewall surface with a predetermined inclination maintained relative to the first main surface and a second sidewall surface with a predetermined inclination maintained relative to the first main surface. The inclination of the first sidewall surface is about the same as the inclination of the second sidewall surface depending on tolerances of the etching process.

In other embodiments, it is desirable to have the sidewalls of the trenches 13 as vertical as possible (i.e., 0° inclination angle). While the trenches 13 extend from the first main or upper surface of the epitaxial layer 5 toward the heavily doped region 3 to the first depth position B, the trenches 13 do not necessarily extend all the way to the heavily doped region 3.

Many geometrical arrangements of trenches 13 and mesas 15 (i.e., in plan view) are also contemplated without departing from the invention.

Referring to FIG. 22, at a first predetermined angle of implantation $\phi$, without the benefit of a masking step, the mesas 15 are implanted with a p dopant, such as boron (B) (i.e., a dopant having a second conductivity or p conductivity), on the first sidewall surface of the trench 13 at a high energy level in the range of about 40 Kilo-electron-volts (KeV) to several Mega-eV. Preferably, the energy level is in the range of about 200 KeV to 1 MeV, but it should be recognized that the energy level should be selected to sufficiently implant the dopant. The first predetermined angle of implantation $\phi$, as represented by thick arrows, determined as described above, can be between about 2° and 12° from vertical and is preferably about 4°. The use of the width A and depth B of the trenches 13 to determine the first predetermined angle of implantation $\phi$ ensures that only the sidewalls of the trenches 13 and not the bottoms of the trenches 13 in the active region are implanted. Consequently, a dopant of the second conductivity type is implanted, at a first predetermined angle of implantation $\phi$, into at least one pre-selected mesa 15 to form at the sidewall surface of the one trench 13 a first doped region of the second conductivity type having a doping concentration lower than that of the heavily doped region 3. Other doping techniques may be utilized, for example, a vapor phase deposition.

The opposite sides or second sidewalls of the trenches 13 are implanted with boron at a second predetermined angle of implantation $\phi'$, as represented by thick arrows. Similar to the first predetermined angle of implantation $\phi$, the second predetermined angle of implantation $\phi'$ can be between about −2° and −12° from vertical and preferably at about −4°. Consequently, a dopant of the second conductivity type is implanted, at a second predetermined angle of implantation $\phi'$, into at least one pre-selected mesa 15 to form at the sidewall surface of the one trench 13 a second doped region of the second conductivity type having a doping concentration lower than that of the heavily doped region 3. Other doping techniques may be utilized, for example, a vapor phase deposition.

Figure 23:
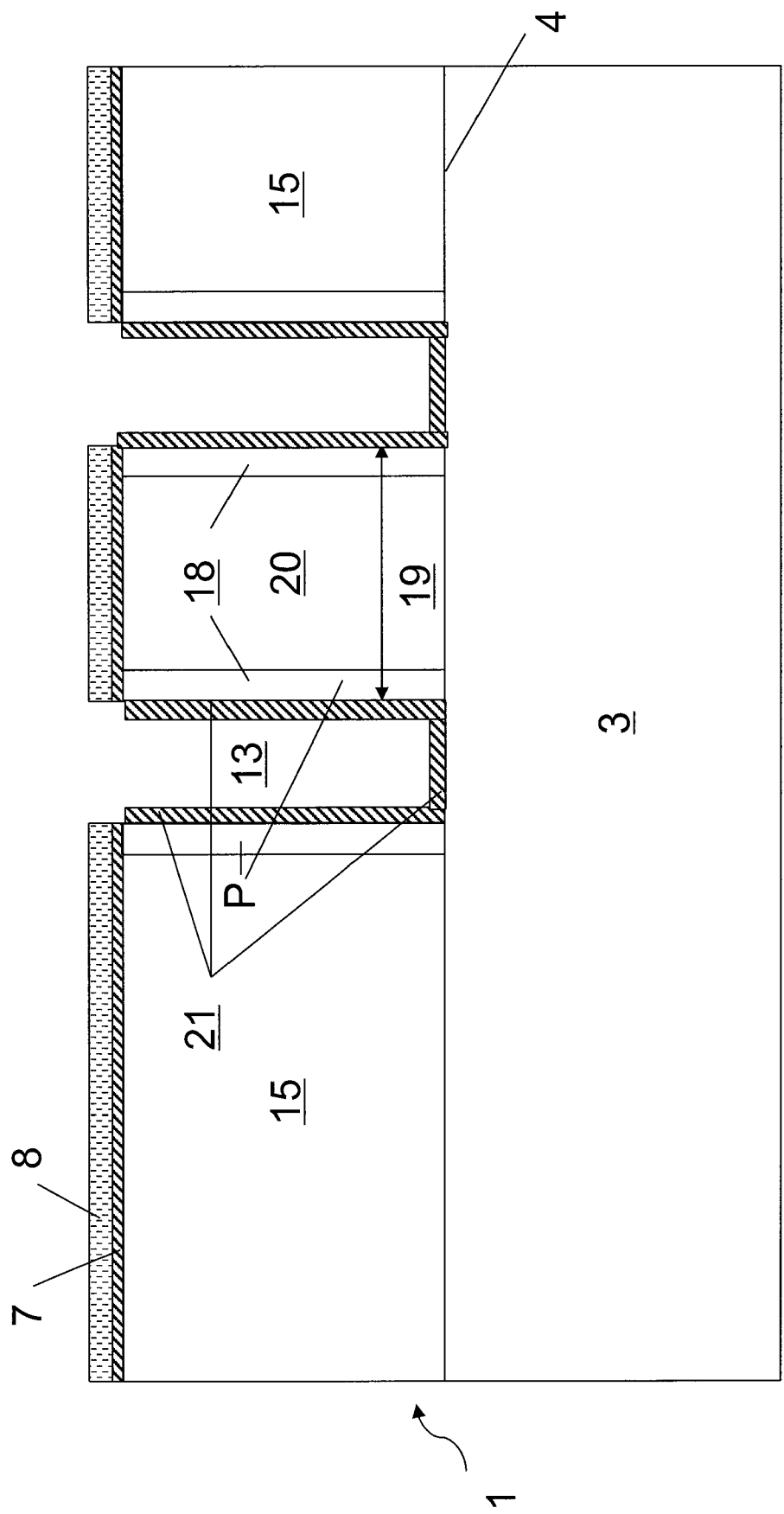
FIG. 23 is a partial cross-sectional elevational view of the semiconductor substrate of FIG. 22 after a drive-in step.

In FIG. 23, following implantation of the second p-type implant (FIG. 22), a drive-in step (i.e., a diffusion) is performed at a temperature of up to about 1200° Celsius for up to about 12 hours. After the drive-in step, the mesas 15 adjacent to two trenches 13 are converted to pnp columns 19, each of which comprises p columns 18 and an n column 20. It should be recognized that the temperature and the time the temperature is maintained are selected to sufficiently drive in the implanted dopant into the mesas 15. Also shown in FIG. 23, oxidation is also performed with the drive-in step, which forms a silicon dioxide layer 21 on the sidewalls and the bottoms of the trenches 13.

Figure 24:
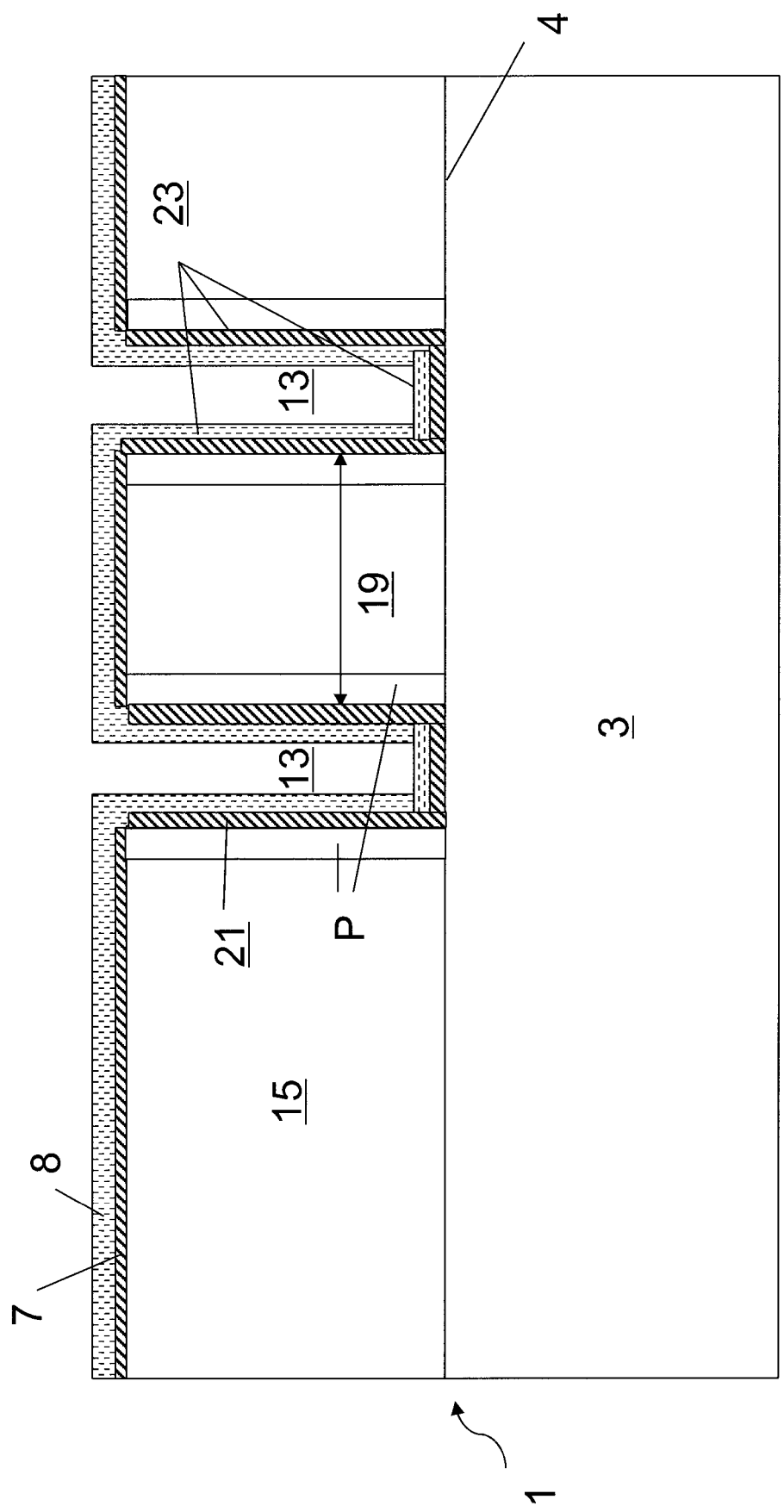
FIG. 24 is a partial cross-sectional elevational view of the semiconductor substrate of FIG. 23 after a thin layer of silicon nitride is deposited on the sidewalls and the bottoms of the trenches.

In FIG. 24, a thin layer of silicon nitride 23 is deposited on the silicon dioxide layer 21 on the sidewalls and the bottoms of the trenches 13. The layer of silicon nitride 23 serves several functions, namely i) balancing the mechanical stress; ii) creating a stop layer for chemical-mechanical-polishing (CMP) or etching; and iii) isolating and protecting the silicon and silicon oxide in the columns 19 from refill material 25 to be deposited in the trenches 13.

The lining of the trenches with silicon nitride 23 is performed, in the present embodiment, using a technique known as low pressure (LP) chemical vapor deposition (CVD) of Tetraethylorthosilicate (TEOS) or simply "LPTEOS." Alternatively, a spun-on-glass (SOG) technique or any other suitable technique may be used to line the trenches 13 with the silicon nitride 23. Preferably, the silicon nitride 23 is about 100 Å to about 1,000 Å thick (1 μm=10,000 Å).

Figure 25:
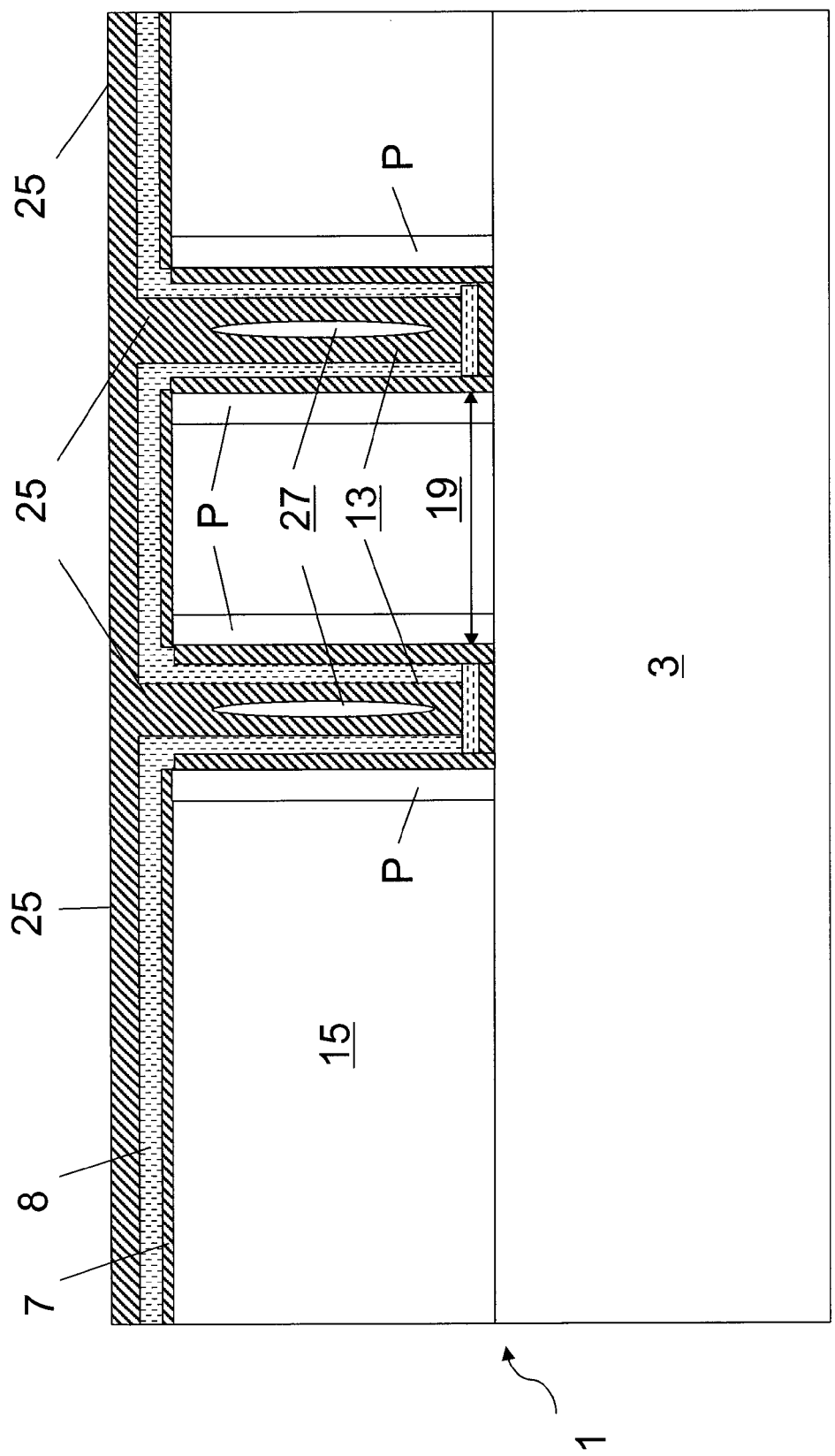
FIG. 25 is a partial cross-sectional elevational view of the semiconductor substrate of FIG. 24 after the trenches are filled.

Referring to FIG. 25, the trenches 13 are then refilled (filled) by SOG technique, typically with an insulating or semi-insulating refill (or fill) material 25, such as a dielectric, a polysilicon, a re-crystalized polysilicon, a single crystal silicon, or SIPOS. Preferably, the trenches 13 are refilled with SIPOS. The amount of oxygen content in the SIPOS is selectively chosen to be between 2% and 80% to improve the electrical characteristics of the active region. Increasing the amount of oxygen content is desirable for electrical characteristics, but varying the oxygen content also results in altered material properties. Higher oxygen content SIPOS thermally expands and contracts differently than the surrounding silicon which may lead to undesirable fracturing or cracking, especially near the interface of differing materials. Accordingly, the oxygen content of the SIPOS is optimally selected to achieve the most desirable electrical characteristics without an undesirable impact on mechanical properties. Also shown in FIG. 25, a top layer of the fill material 25 is also deposited by the SOG technique over the silicon nitride layer 8 on the top surface of the pnp columns 19 and the mesas 15 at the edge portions of the substrate 1.

In order to create the device features for a transistor to be formed thereon, the top surface of the pnp columns 19 must be exposed. In some embodiments, planarization by CMP or other techniques known in the art can be performed so as to sufficiently expose the pnp columns 19 while preventing the opening of any internal voids 27 in the fill material 25 that may have occurred during the fill process. Preferably, the planarization is about 1.0-1.5 µm.

Figure 26:
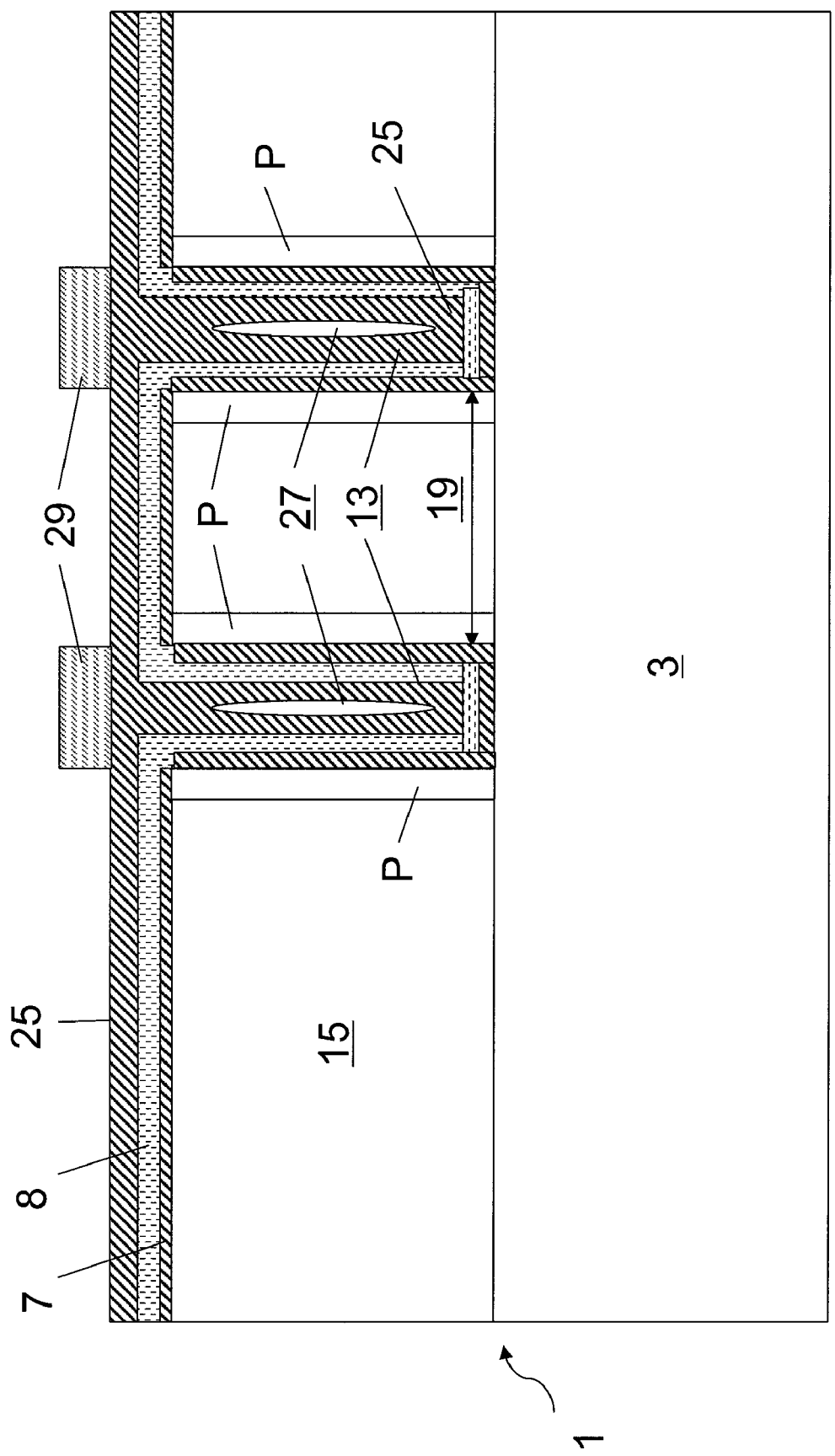
FIG. 26 is a partial cross-sectional elevational view of the semiconductor substrate of FIG. 25 after a photoresist mask is formed to protect the top surface of the filled trenches.
Figure 27:
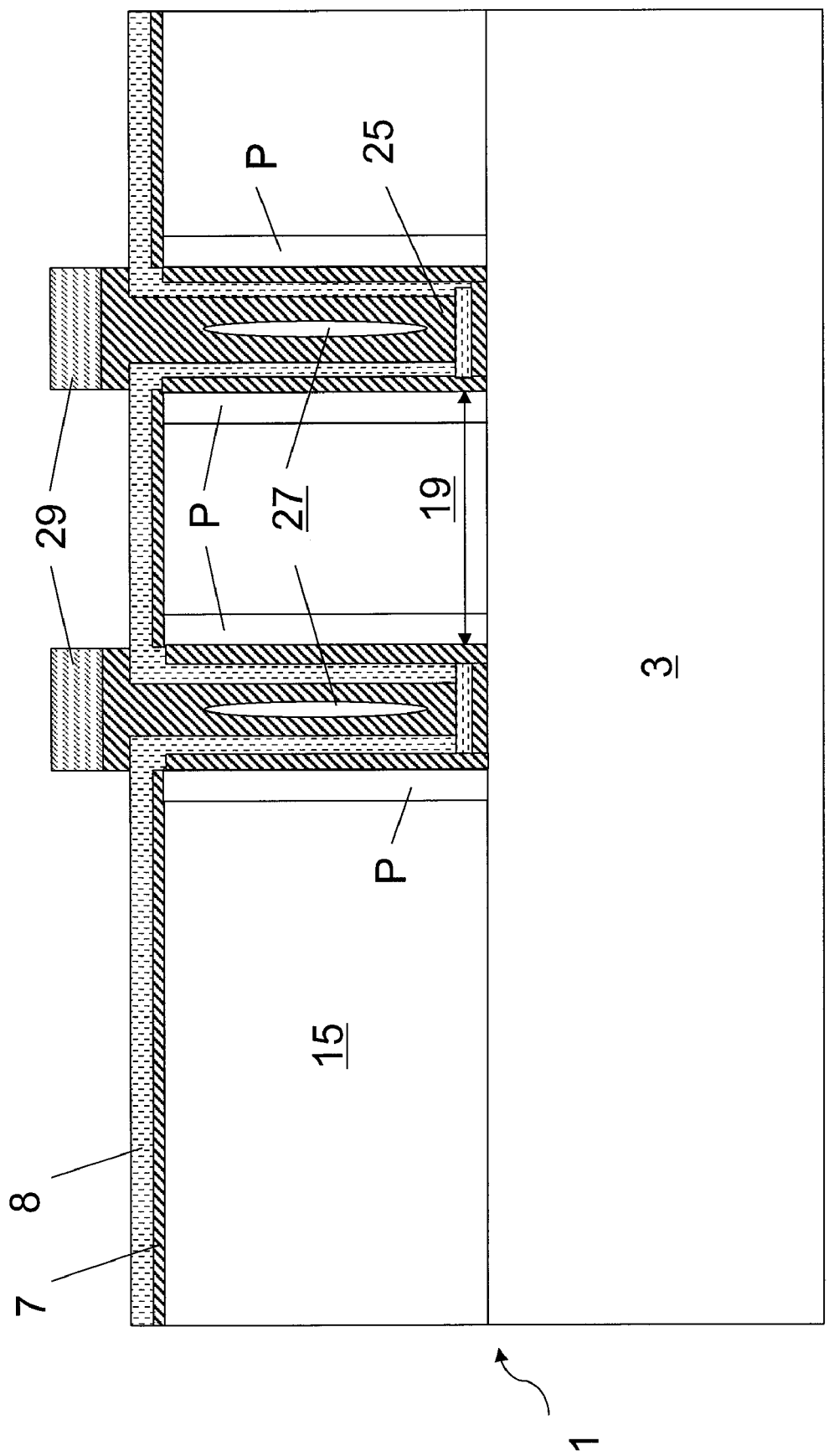
FIG. 27 is a partial cross-sectional elevational view of the semiconductor substrate of FIG. 26 after the top layer of refill material is etched by oxide etching.
Figure 28:
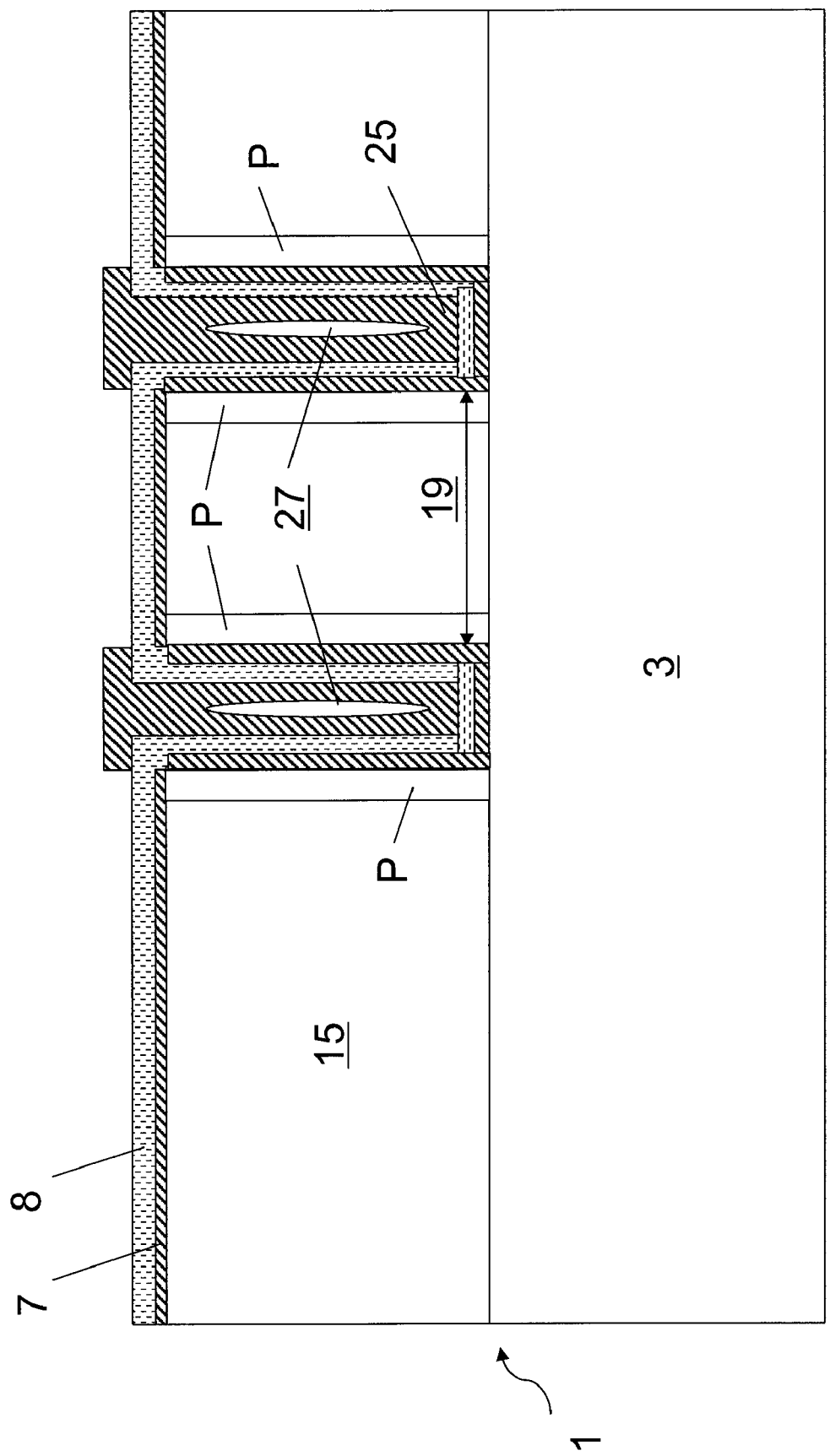
FIG. 28 is a partial cross-sectional elevational view of the semiconductor substrate of FIG. 27 after photoresist (PR) stripping is performed to remove the photoresist mask that protects the top surfaces of the filled trenches.
Figure 29:
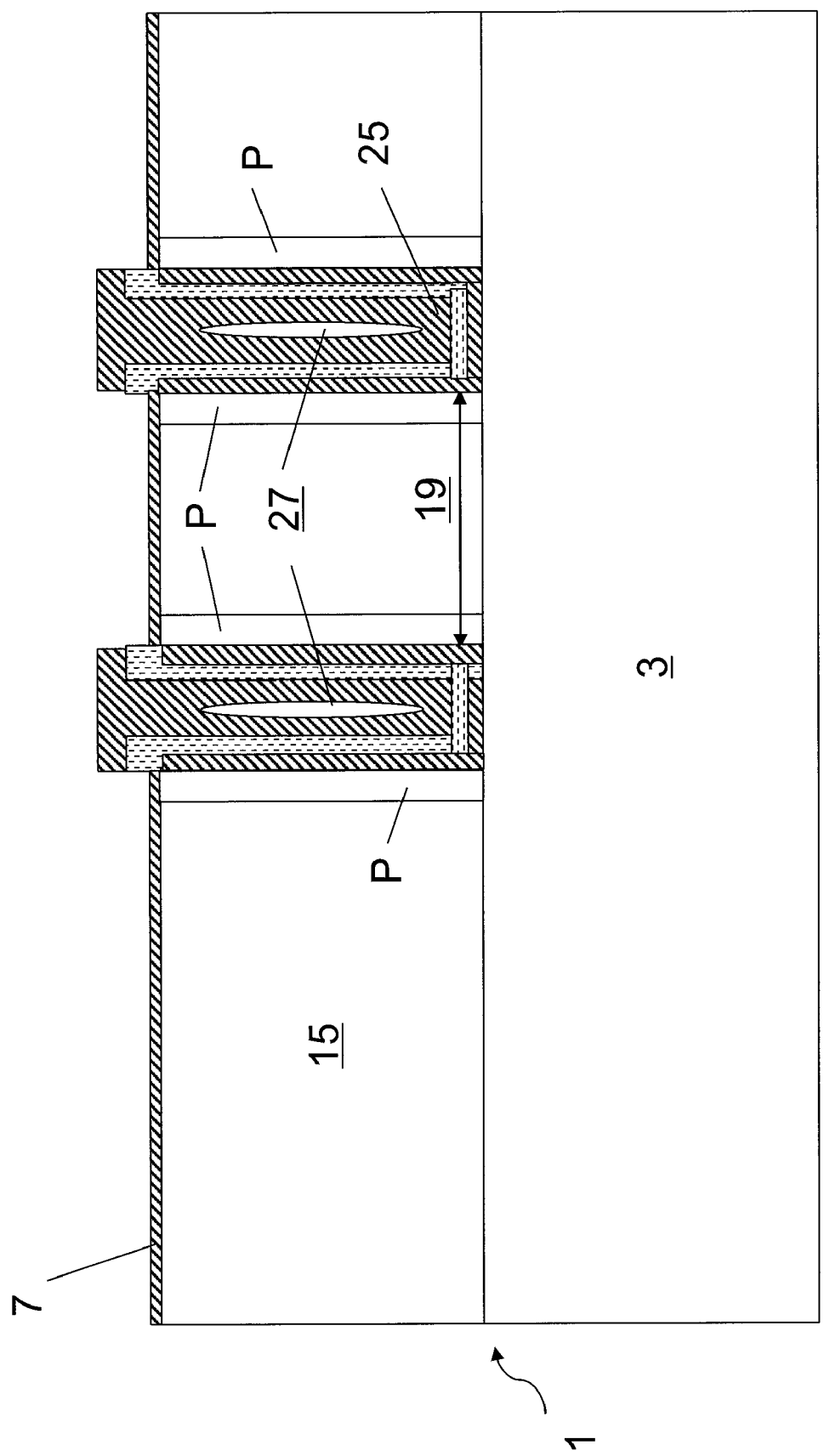
FIG. 29 is a partial cross-sectional elevational view of the semiconductor substrate of FIG. 28 after the silicon nitride layer is etched.
Figure 30:
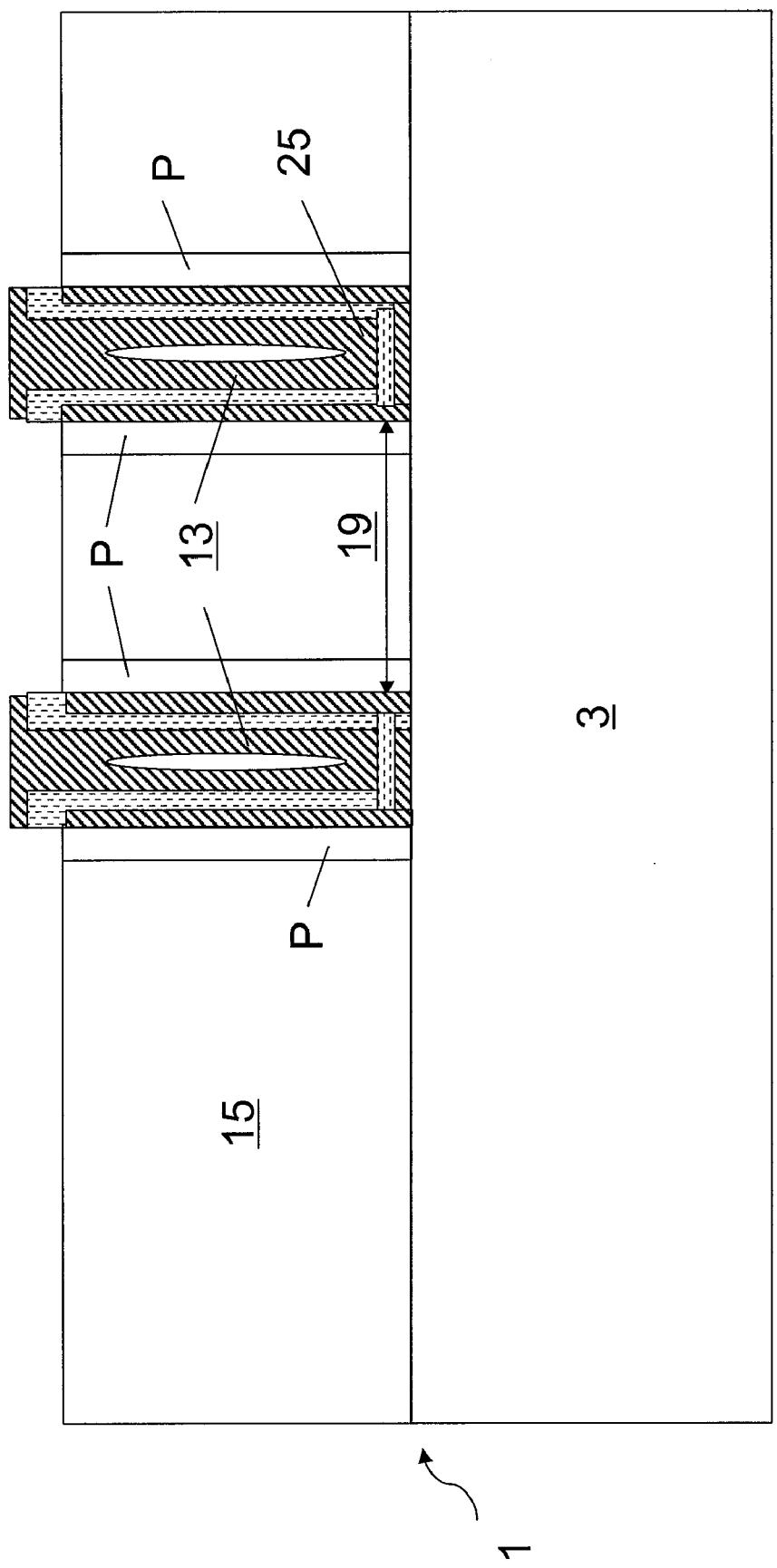
FIG. 30 is a partial cross-sectional elevational view of the semiconductor substrate of FIG. 29 after the silicon oxide layer 7 in FIG. 29 is etched by oxide wet etching to expose the top surface of the column.

FIGS. 26-30 illustrate process steps that may be used to expose the top surfaces of the pnp columns 19. In FIG. 26, a photoresist mask 29 is formed to protect the filled trenches 13. In FIG. 27, the fill material layer 25 is etched by oxide dry etching to remove the fill material layer 25 from the areas other than those above the filled trenches 13. In FIG. 28, PR stripping is performed to remove the photoresist mask 29 from above the filled trenches 13. In FIG. 29, the silicon nitride layer 8 is etched for removal by methods known in the art. In FIG. 30, the silicon oxide layer 7 is etched for removal by oxide wet etching.

Figure 31:
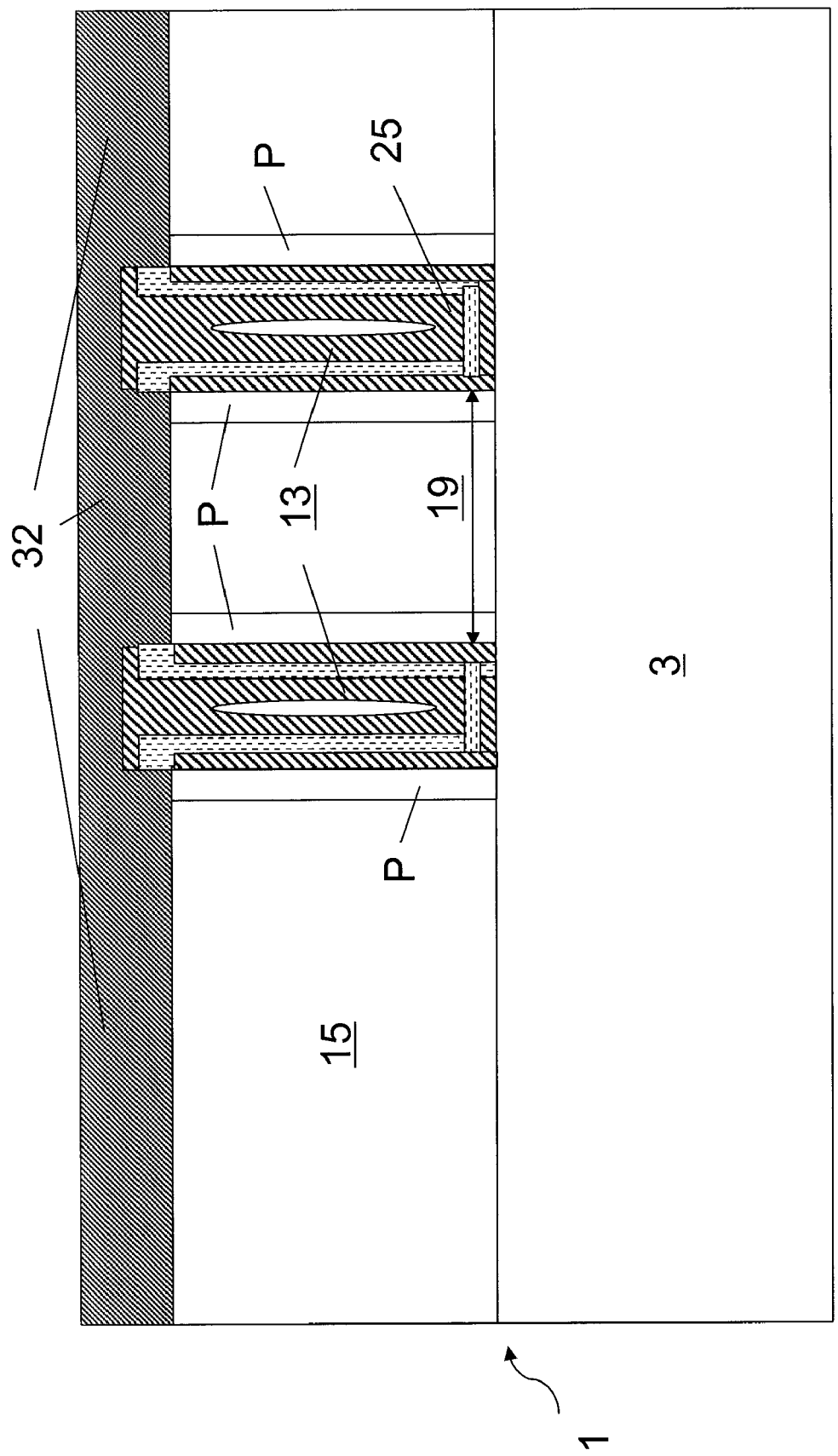
FIG. 31 is a partial cross-sectional elevational view of the semiconductor substrate of FIG. 30 after metallization is performed by depositing the metal layer(s) over the top surface of the substrate.

Referring to FIG. 31, using methods known in the field, metallization is performed to deposit a layer of metal 32 over the top surface of the filled trenches 13, the pnp columns 19, and the mesas 15 at the edge portions of the substrate 1. Schottky contact is formed between the metal layer 32 and the top surface of columns 19. Note that only metal and semiconductor contacts capable of rectifying currents are considered Schottky contacts. Rectifying properties depend on the work function of the metal, the band gap of the intrinsic semiconductor, and the type and concentration of dopants in the semiconductor. Design and formation of a Schottky contact is known to those skilled in the art.

Figure 32:
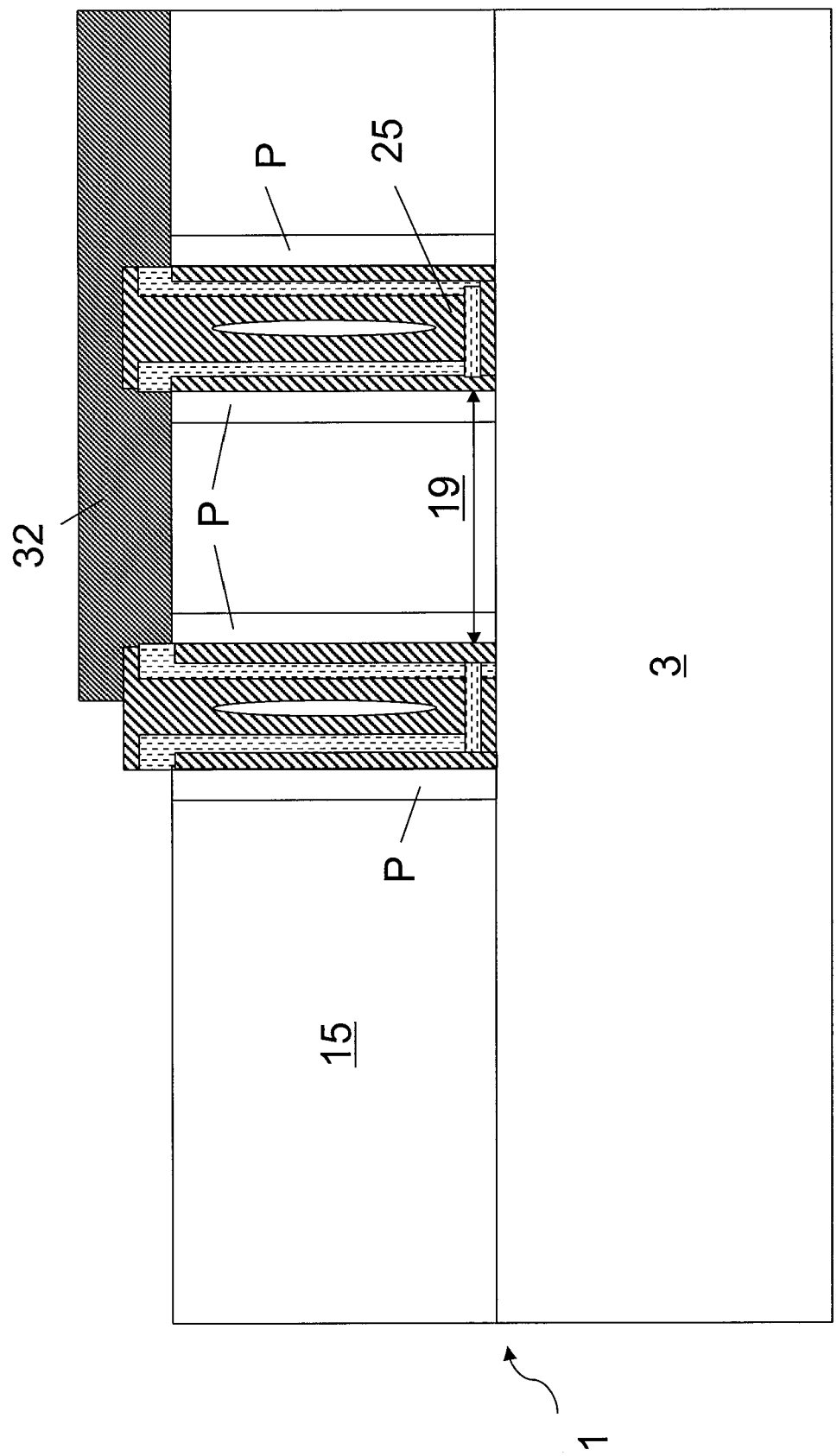
FIG. 32 is a partial cross-sectional elevational view of the semiconductor substrate of FIG. 31 after the edge portions of metal layer(s) over the top surface of the mesas is removed by metal etching.
Figure 33:
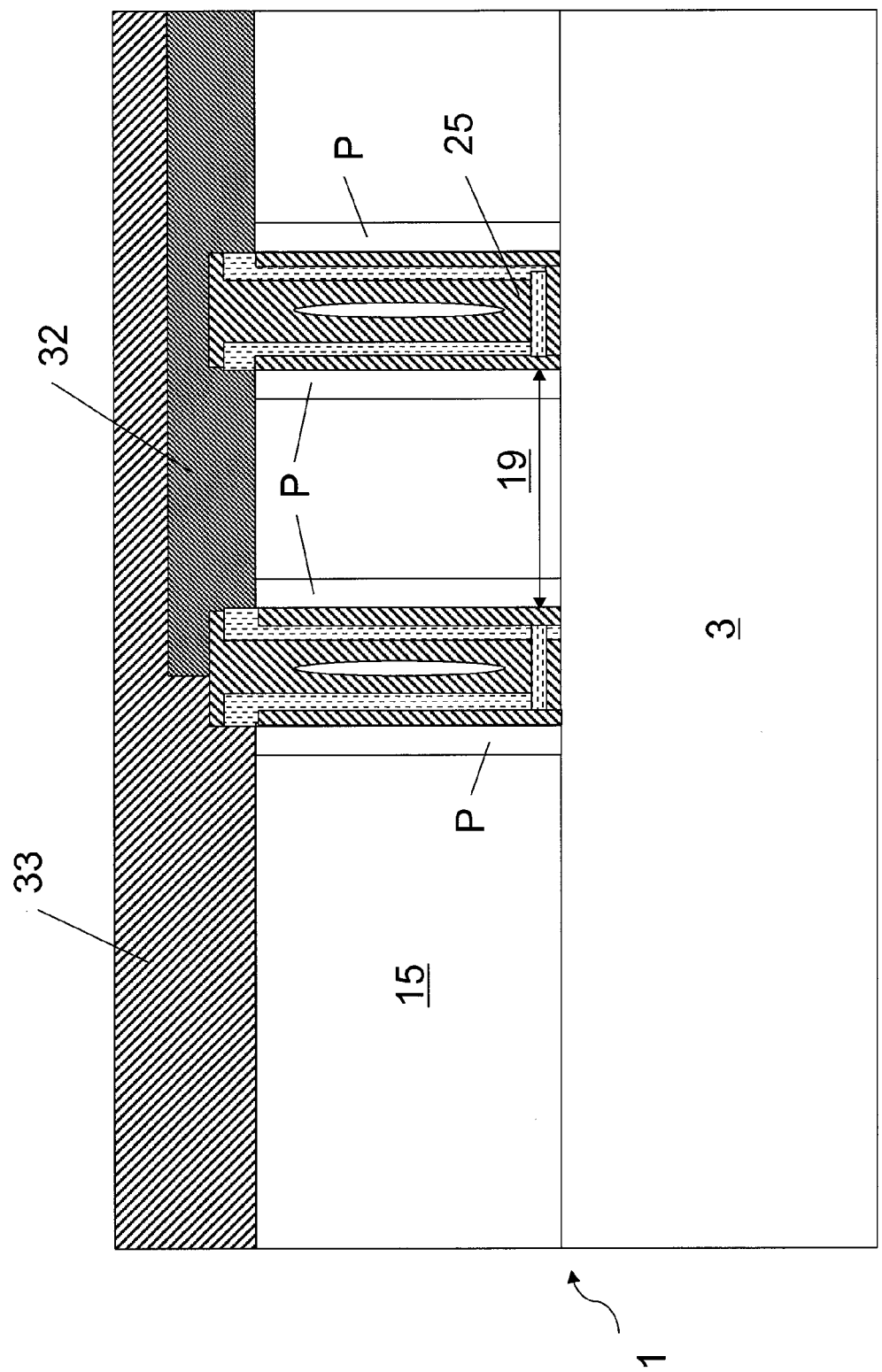
FIG. 33 is a partial cross-sectional elevational view of the semiconductor substrate of FIG. 32 after a passivation layer is formed over the top surface of the substrate.
Figure 34:
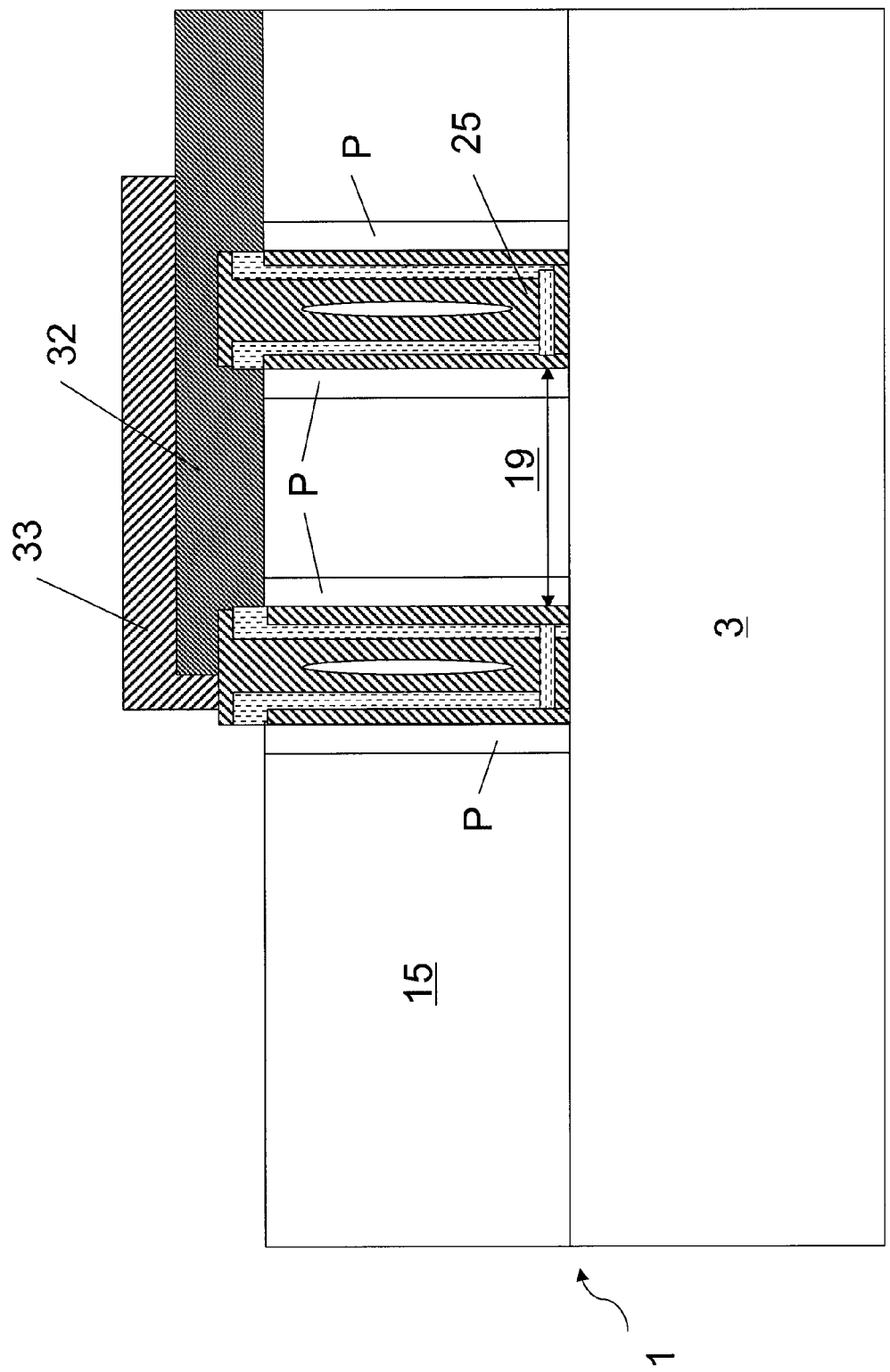
FIG. 34 is a partial cross-sectional elevational view of the semiconductor substrate of FIG. 33 after pad openings and scribeline openings are formed by removing the passivation layer at the appropriate positions.
Figure 35A:
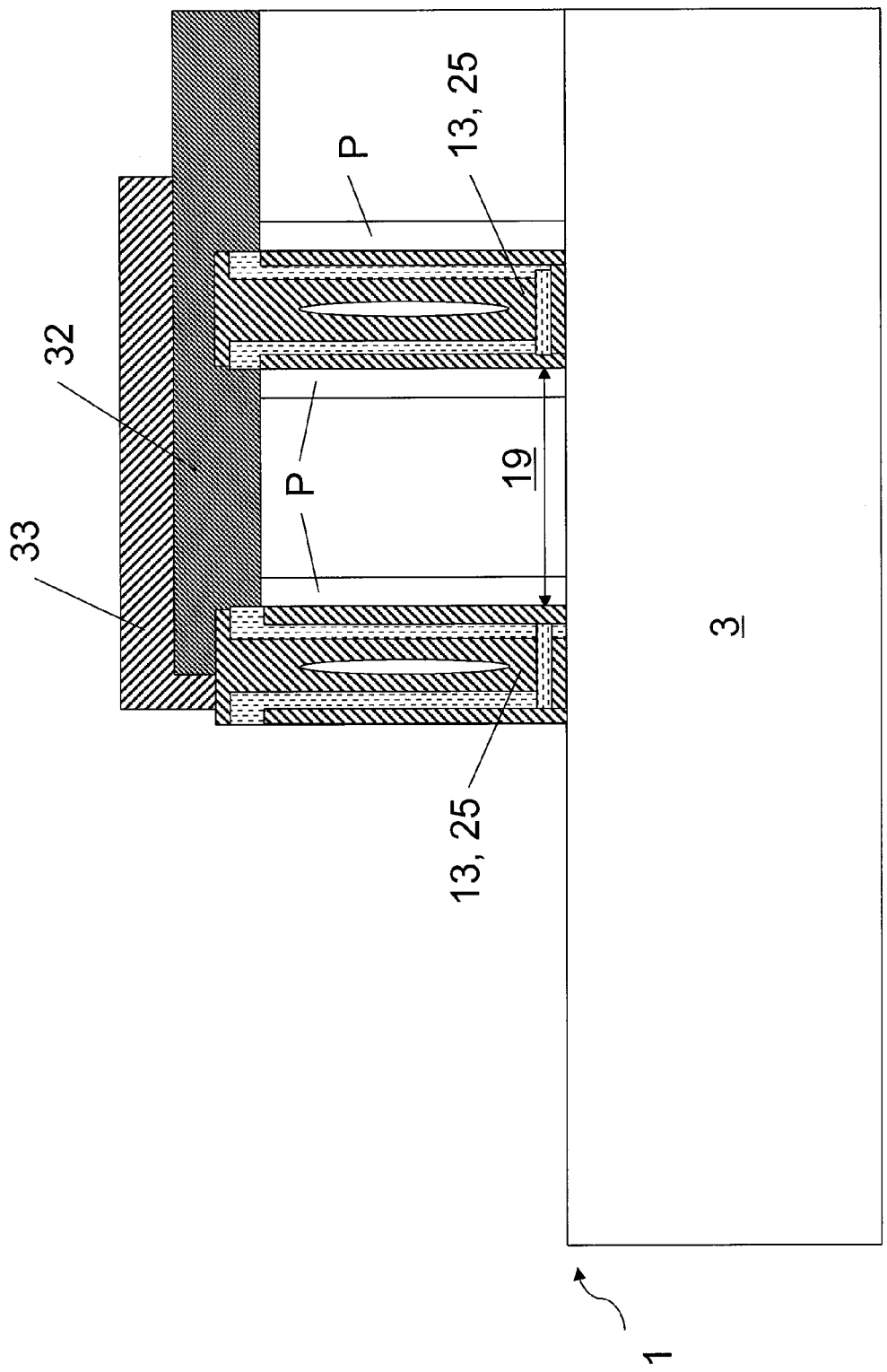
FIG. 35A is a partial cross-sectional elevational view of the semiconductor substrate of FIG. 34 after the mesas at the edge portions of the substrate are removed by self-aligning silicon etching.
Figure 35B:
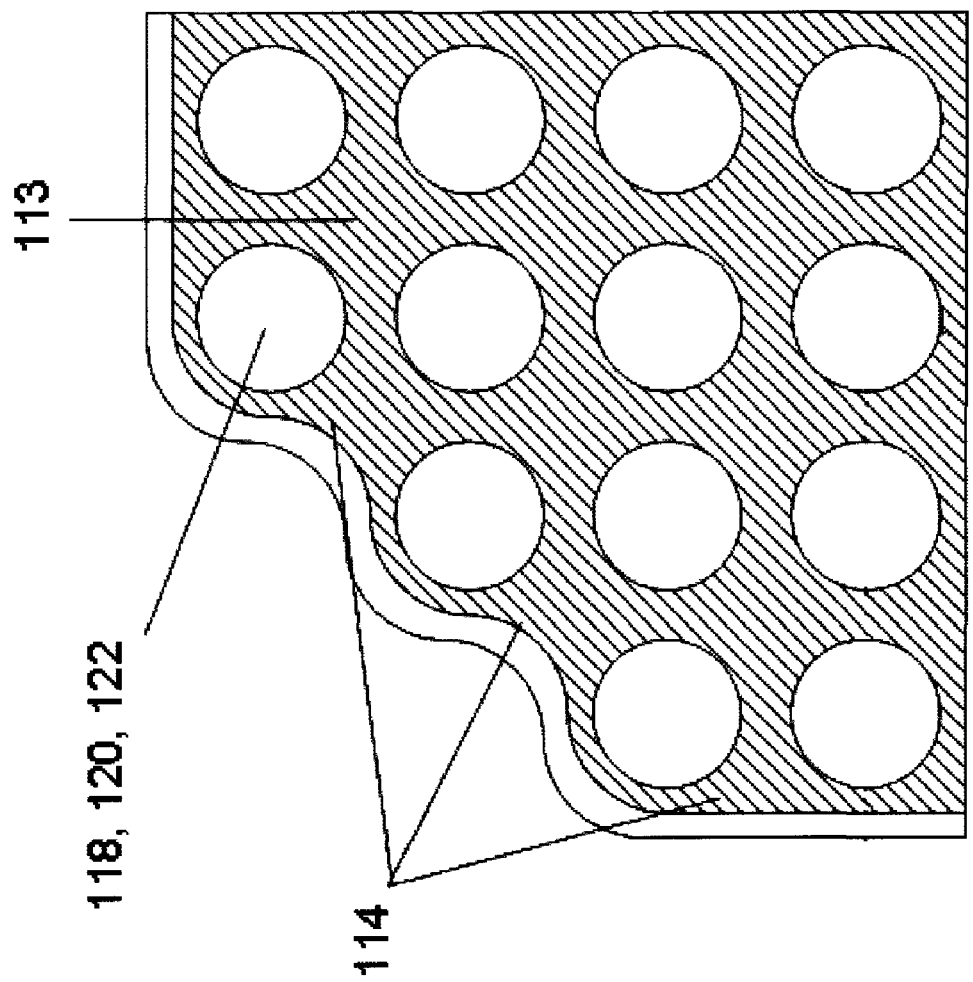
FIG. 35B is a partial top plan view of the active region layout of the semiconductor substrate of FIG. 35A.

In FIG. 32, the metal layer 32 over the top surface of the mesas 15 at the edge portions of the substrate 1 is removed by metal etching. In FIG. 33, a passivation layer 33 is formed over the top surface of the mesas 15 at the edge portions of the substrate 1 and the remaining metal layer 32, using an appropriate passivation material such as nitride, oxide, phosphosilicate glass (PSG), or undoped silicate glass (USG). The passivation layer 33 protects the exposed metallurgical junctions. In FIG. 34, pad openings 34 and scribe line openings 36 are formed by removing portions of the passivation layer 33 at the appropriate positions. In FIG. 35A, the mesa 15 at the edge portion of the substrate is removed by self-aligning silicon etching and slight silicon wet etching. This results in a semiconductor device 35 having trenches 13 filed with the refill material 25 at the edge portions and the active region at the center. The active region including the pnp columns 19 and the trenches 13 is filled with the refill material 25. A partial top plan view of the active region layout is shown in FIG. 35B, with each of the dots representing a pnp column 19 and the striped background representing the refill material 25.

Figure 36:
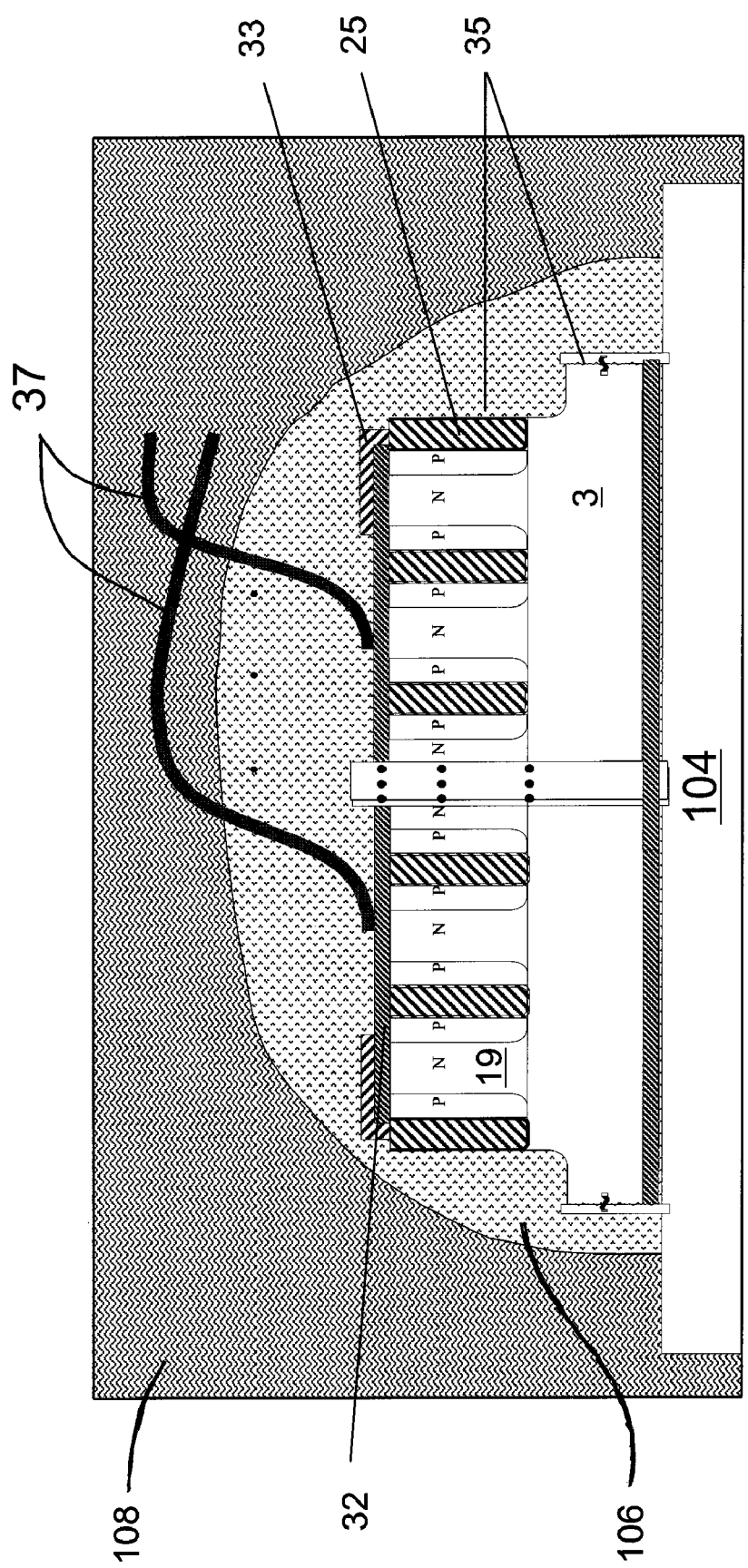
FIG. 36 is a schematic cross-sectional elevational view of a packaged superjunction Schottky transistor according to a preferred embodiment of the present invention.

Referring to FIG. 36, the metal layer 32 functions as the gate electrode in a Schottky diode, and bondwire 37 is connected to the gate electrode 32. A package inner layer/underfilling 106 comprising a dielectric such as glass, ceramic, or the like is used to encapsulate the active region within the semiconductor substrate 35. A polymeric molding compound 108 is used to further encapsulate the package inner layer/underfilling 106, the semiconductor substrate, and the copper slog of the leadframe 104, which serves as the base frame for the semiconductor substrate 35 and the package inner layer/underfilling 106.

Figure 37:
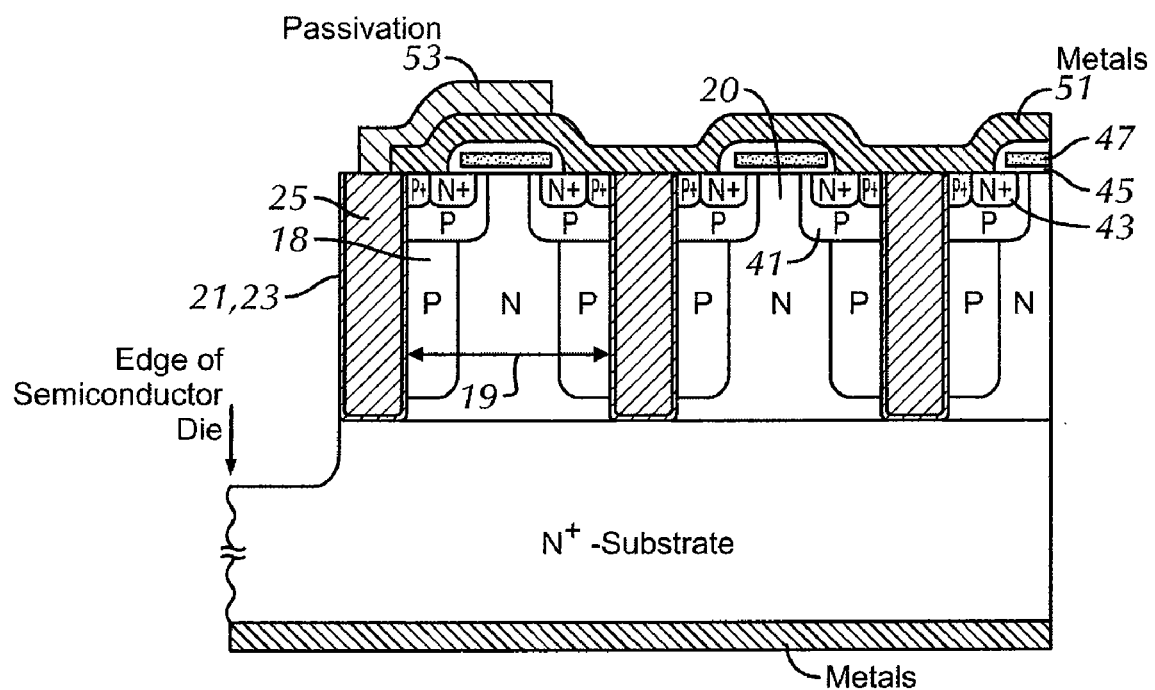
FIG. 37 is partial cross-sectional elevational view of a superjunction MOSFET according to a preferred embodiment of the present invention.

FIG. 37 is partial cross-sectional elevational view of a cell of a MOSFET superjunction device that can be manufactured by process steps similar to those depicted in FIG. 15-36. The MOSFET superjunction device has pn-np columns 19 having p columns 18 and n column 20. Each of the pn-np columns 19 is isolated from other neighboring cells by oxide liner 21 and silicon nitride liner 23 and the SIPOS or poly refill 25 with the refill void 27. The $n^+$ region 3 functions as a drain and the pn-np column 19 is disposed thereon. The device also includes a p body region 41 in which there are formed n-source connector regions 43. An oxide layer 45 separates a gate poly region 47 from the n source connector 43 and the p body 41. A metal layer 51 is disposed over the pn-np columns 19 and the SIPOS filled trenches 25. A passivation layer 53 is disposed on the metal layer 51 adjacent the pn-np column 19 closest to the edge of the substrate 3.

As mentioned above, the processes are versatile as the n columns and p columns can be exchanged. For the manufacture of p-channel devices the substrate is $p^+$ and for n-channel devices the substrate is $n^+$. The refill material can be doped or undoped oxide, semi-insulating material (such as SIPOS), SOQ, doped or undoped polysilicon (poly), nitride or a combination of materials.

From the foregoing, it can be seen that embodiments of the present invention are directed to a superjunction device having a dielectric termination and methods for manufacturing a superjunction device having dielectric termination. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:
1. A superjunction semiconductor device comprising:
(a) at least one column of a first conductivity type extending from a first main surface of a semiconductor substrate toward a second main surface of the semiconductor substrate opposed to the first main surface;
(b) at least one column of a second conductivity type extending from the first main surface toward the second main surface, the at least one column of the second conductivity type having a first sidewall surface proximate the at least one column of the first conductivity type and a second sidewall surface opposed to the first sidewall surface; and
(c) a termination structure proximate the second sidewall surface of the at least one column of the second conductivity type, the termination structure comprising a layer of dielectric of an effective thickness and consuming about 0% of a surface area of the first main surface of the semiconductor substrate, a first surface of the termination structure being proximate to the at least one column of the second conductivity type and an opposing second surface of the termination structure being in direct contact with a material that encapsulates the semiconductor substrate.

2. The superjunction semiconductor device of claim 1, wherein the termination structure comprises one of a trench filled with dielectric and a passivation layer.

3. The superjunction semiconductor device of claim 1, wherein the dielectric is one of air, a nitride, an oxide, a semi-insulating polycrystalline silicon (SIPOS), a silicon-rich nitride, silicon carbide, and a combination thereof.

4. The superjunction semiconductor device of claim 1, wherein the termination structure comprises one of glass, ceramic, plastic, and a combination thereof.

5. The superjunction semiconductor device of claim 1, wherein the termination structure comprises an inner layer/underfilling of a package that encapsulates the superjunction semiconductor substrate.

6. The superjunction semiconductor device of claim 1, wherein the effective thickness is at least about 150 μm.

7. The superjunction semiconductor device of claim 1, wherein the dielectric has a dielectric constant of about 1.0 to about 4.5.

8. The superjunction semiconductor device of claim 1 being one of a superjunction metal-oxide-semiconductor field-effect transistor (MOSFET), a superjunction metal-semiconductor field-effect transistor (MOSFET), a superjunction Schottky transistor, a superjunction Schottky diode, a superjunction insulated-gate bipolar transistor (IGBT), a thyristor, and a superjunction diode.

* * * * *